United States Patent [19]
Tsuji et al.

[11] Patent Number: 5,821,622
[45] Date of Patent: Oct. 13, 1998

[54] LIQUID CRYSTAL DISPLAY DEVICE

[75] Inventors: Yoshiko Tsuji, Kawasaki; Mitsushi Ikeda; Hisao Toeda, both of Yokohama; Yoshifumi Ogawa, Kawasaki; Toshiyuki Oka, Yokohama, all of Japan

[73] Assignee: Kabushiki Kaisha Toshiba, Kawasaki, Japan

[21] Appl. No.: 633,346

[22] Filed: Apr. 17, 1996

Related U.S. Application Data

[63] Continuation-in-part of Ser. No. 208,831, Mar. 11, 1994, abandoned.

[30] Foreign Application Priority Data

Mar. 12, 1993 [JP] Japan ................................ 5-052675

[51] Int. Cl.⁶ ..................... H01L 23/48; H01L 23/52; H01L 29/40
[52] U.S. Cl. .................. 257/763; 257/72; 257/770
[58] Field of Search .................... 257/763, 764, 257/770, 72

[56] References Cited

U.S. PATENT DOCUMENTS

| | | | |
|---|---|---|---|
| 5,150,233 | 9/1992 | Enonmoto et al. | 359/54 |
| 5,340,491 | 8/1994 | Enomoto et al. | 252/79.1 |
| 5,373,377 | 12/1994 | Ogawa et al. | 359/59 |
| 5,459,090 | 10/1995 | Yamazaki et al. | 437/43 |

FOREIGN PATENT DOCUMENTS

| | | |
|---|---|---|
| 55-12920 | 1/1980 | Japan . |
| 1-231024 | 9/1989 | Japan . |
| 3-9569 | 1/1991 | Japan . |
| 4-280824 | 10/1992 | Japan . |

*Primary Examiner*—Ngân V. Ngô
*Attorney, Agent, or Firm*—Oblon, Spivak, McClelland, Maier & Neustadt, P.C.

[57] ABSTRACT

The present invention provides a liquid crystal display device including a plurality of address wiring lines formed of an Mo—W alloy, a plurality of data wiring lines intersecting the address wiring lines, with insulating films interposed at intersection portions of the data wiring lines and the address wiring lines, display regions having pixel electrodes arranged respectively for the intersection portions, and a plurality of switching elements provided adjacent to the intersection portions and having control electrodes connected electrically to the address wiring lines, first main electrodes connected electrically to the data wiring liens, and second main electrodes connected electrically to the pixel electrodes.

12 Claims, 16 Drawing Sheets

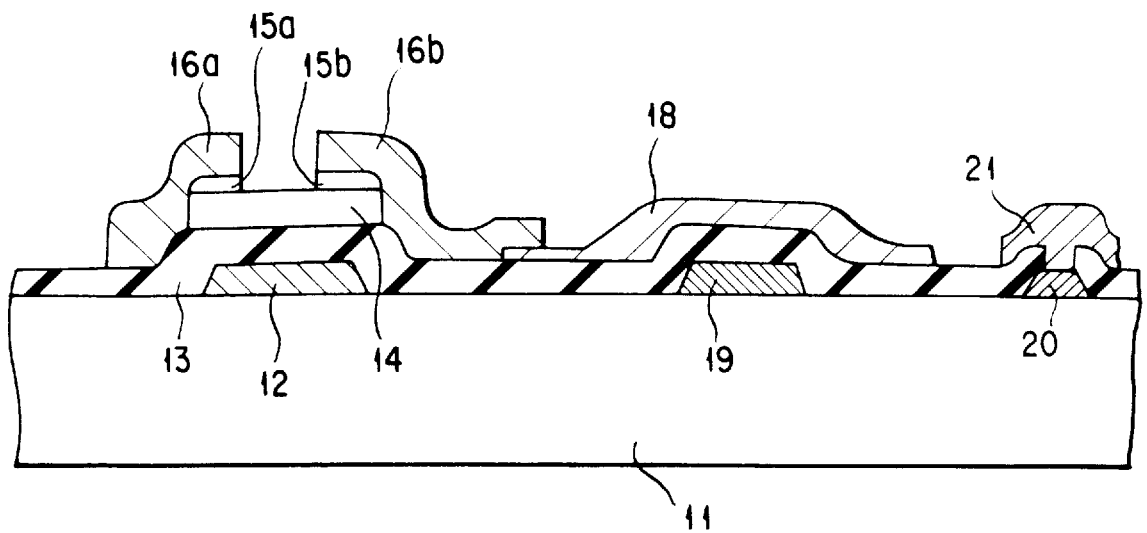
F I G. 2

INCREMENTAL STRESS VS SPUTTERING GAS PRESSURE FOR Mo-W SPUTTERD IN ARGON

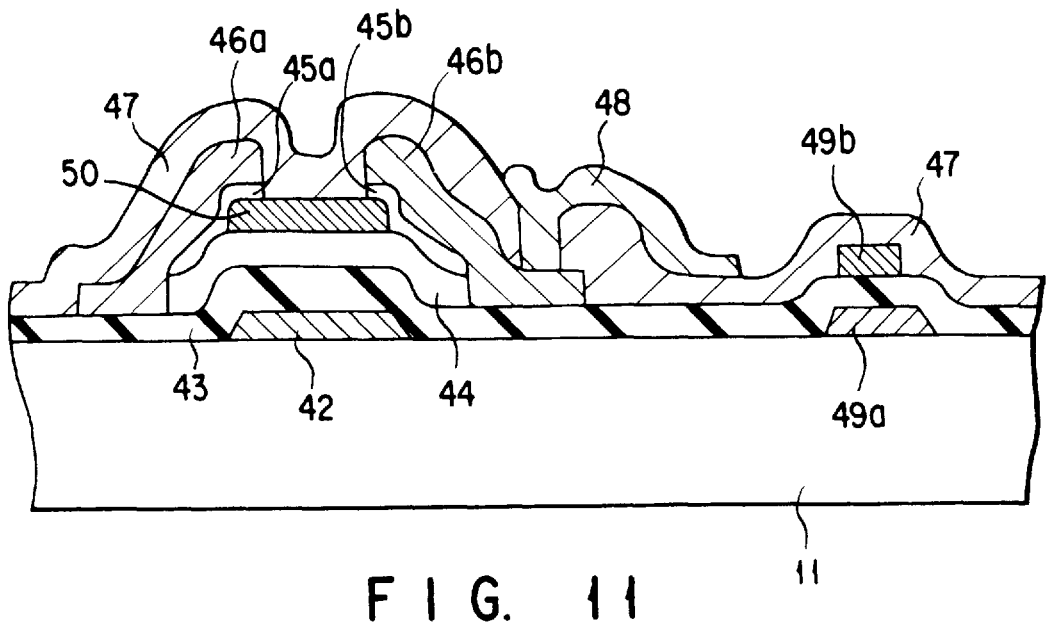
F I G. 11
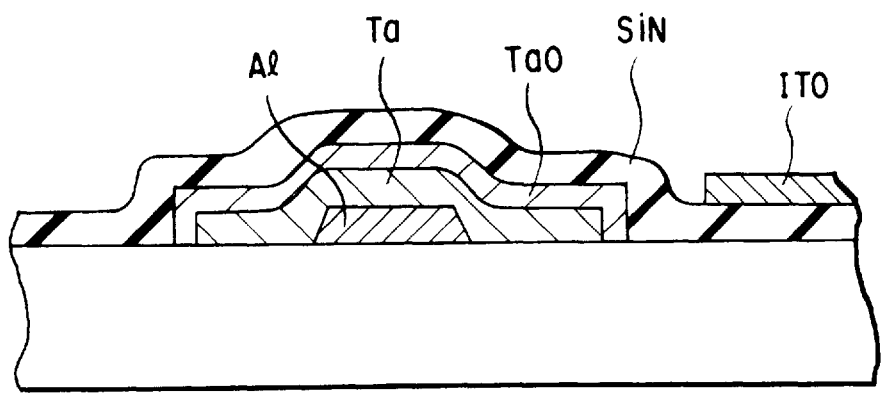
F I G. 12

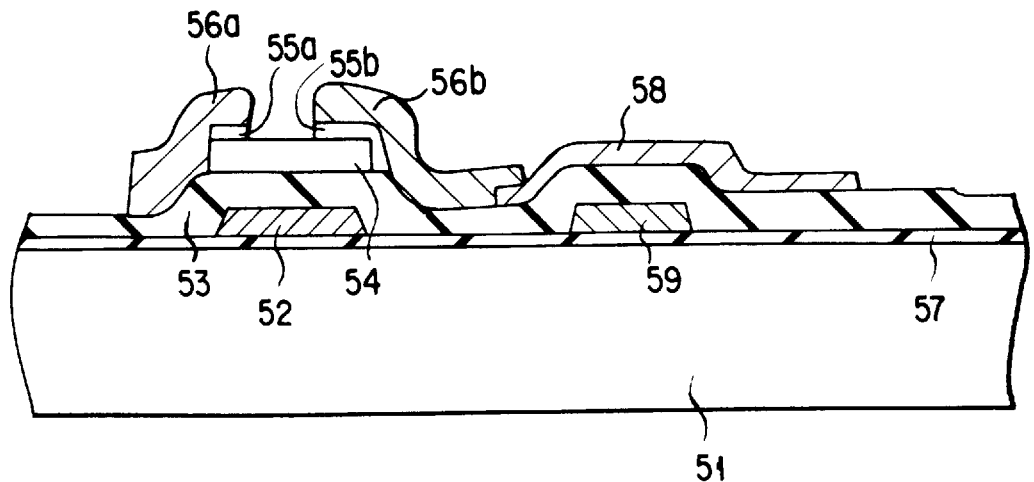
F I G. 13
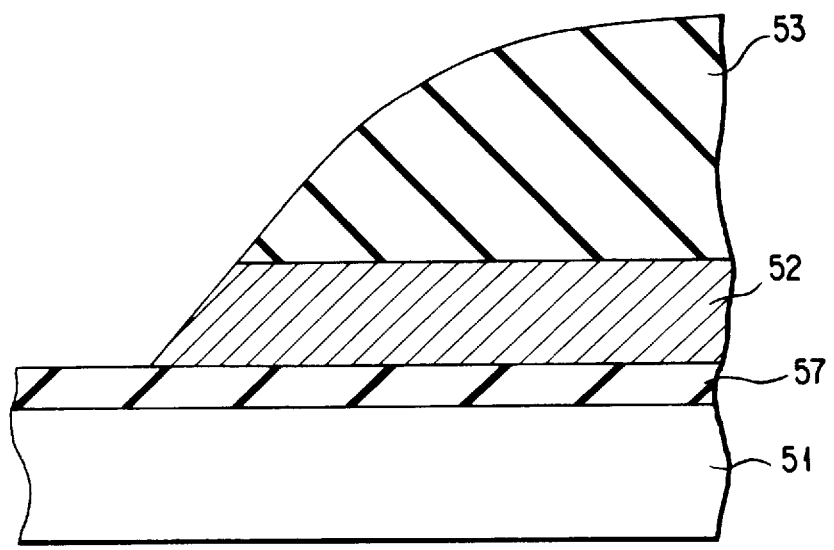
F I G. 14

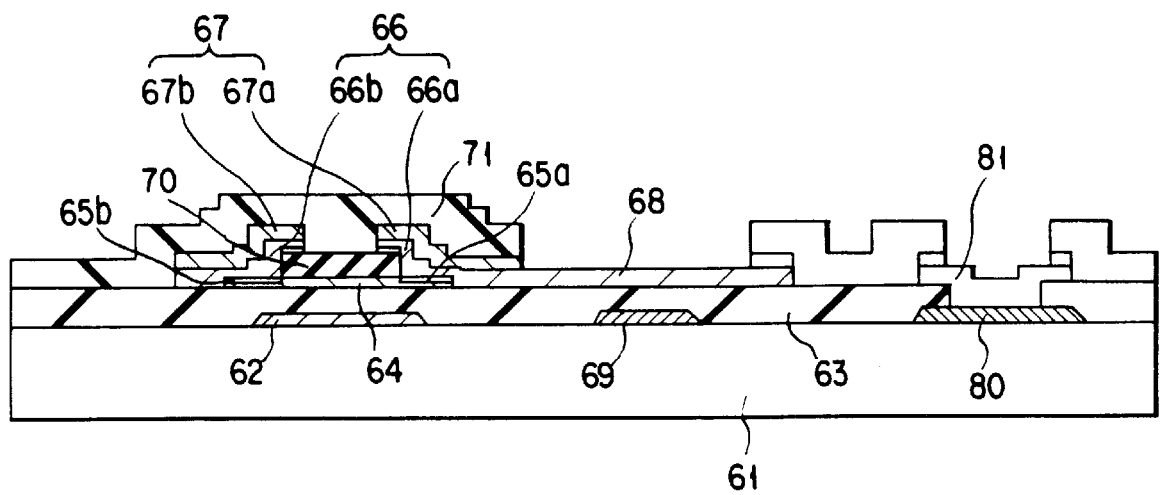
F I G. 15
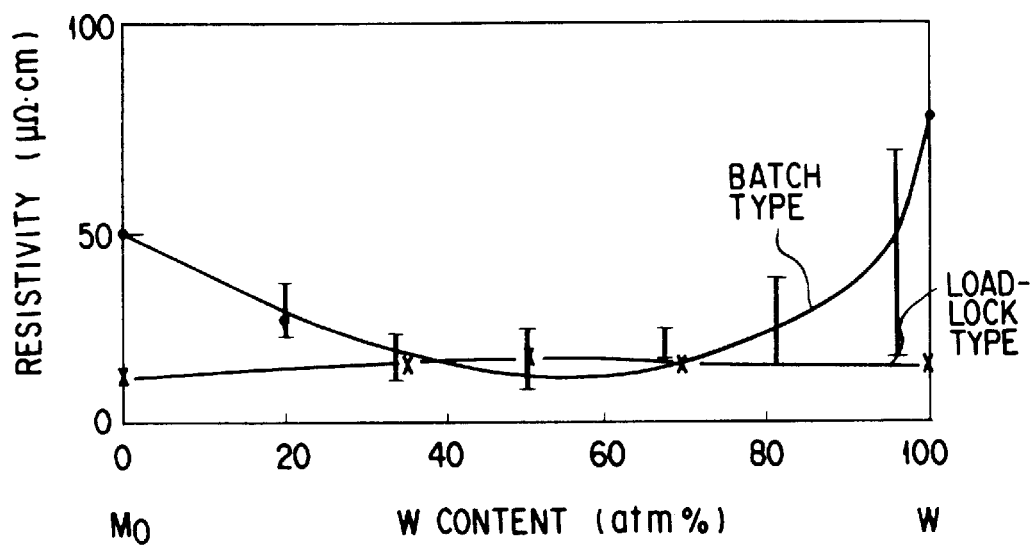
F I G. 16

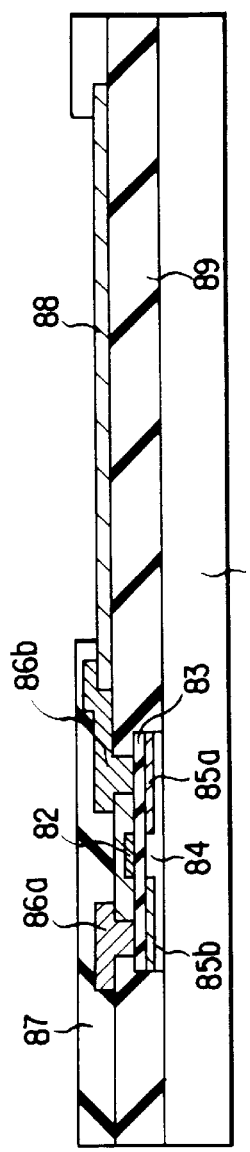
F I G. 17
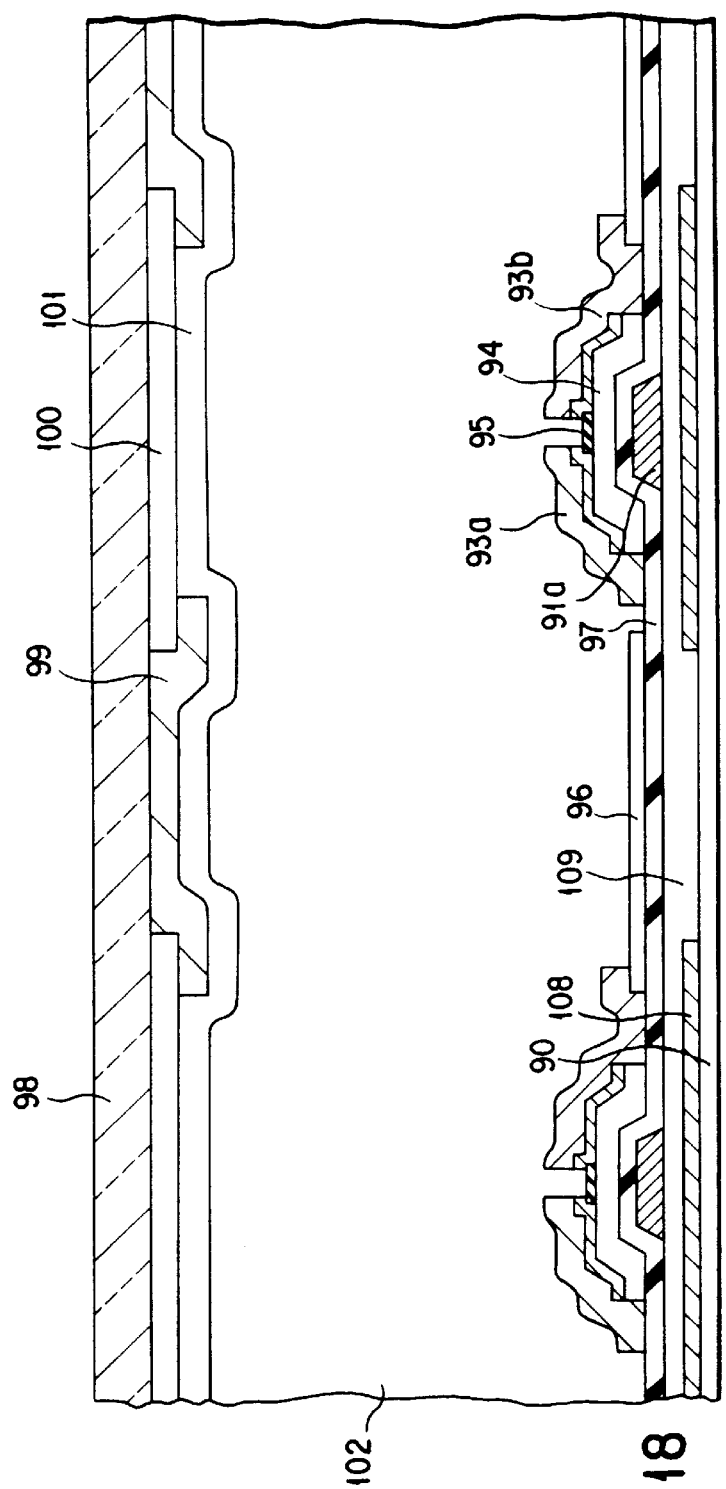
F I G. 18

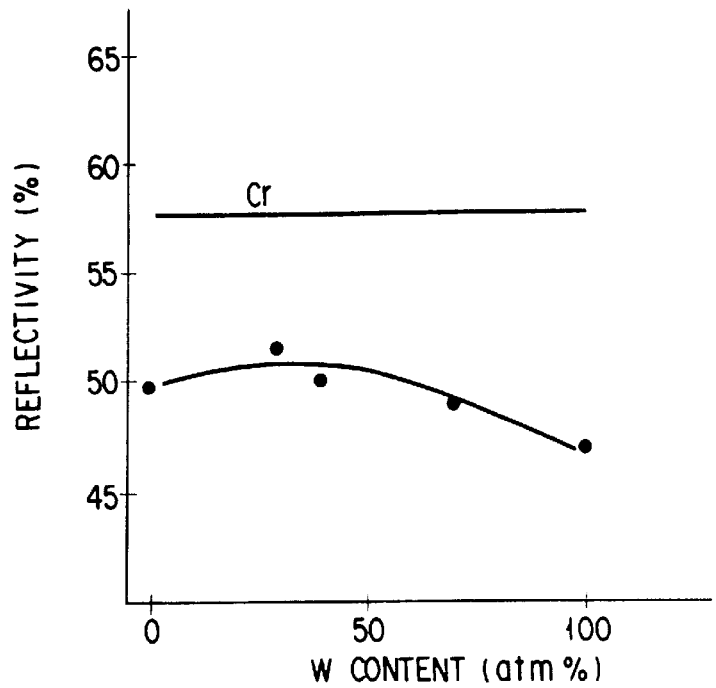
F I G. 19
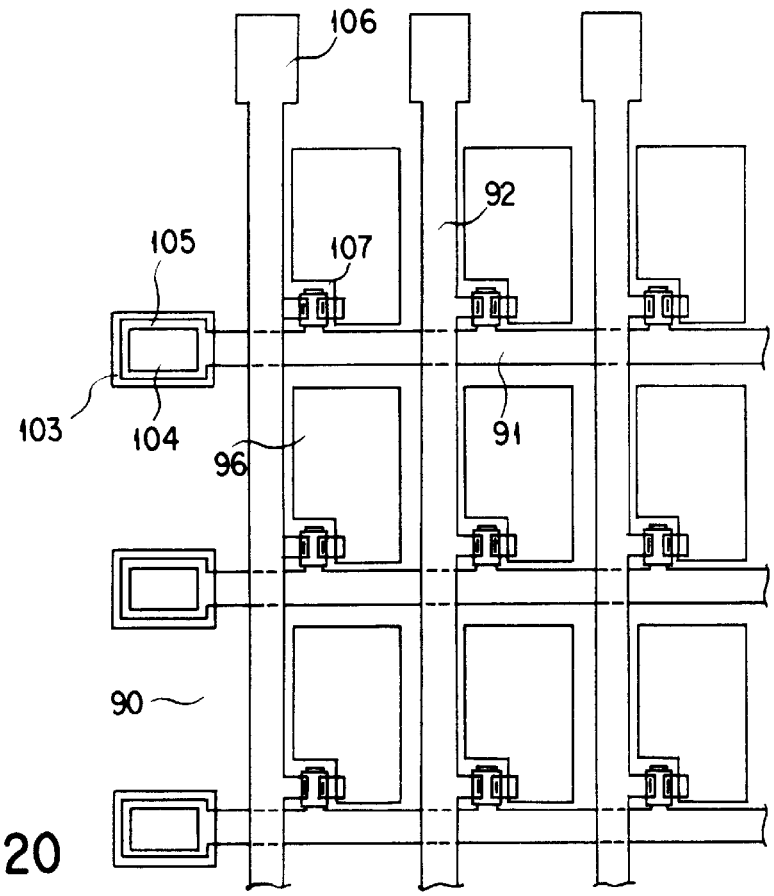
F I G. 20

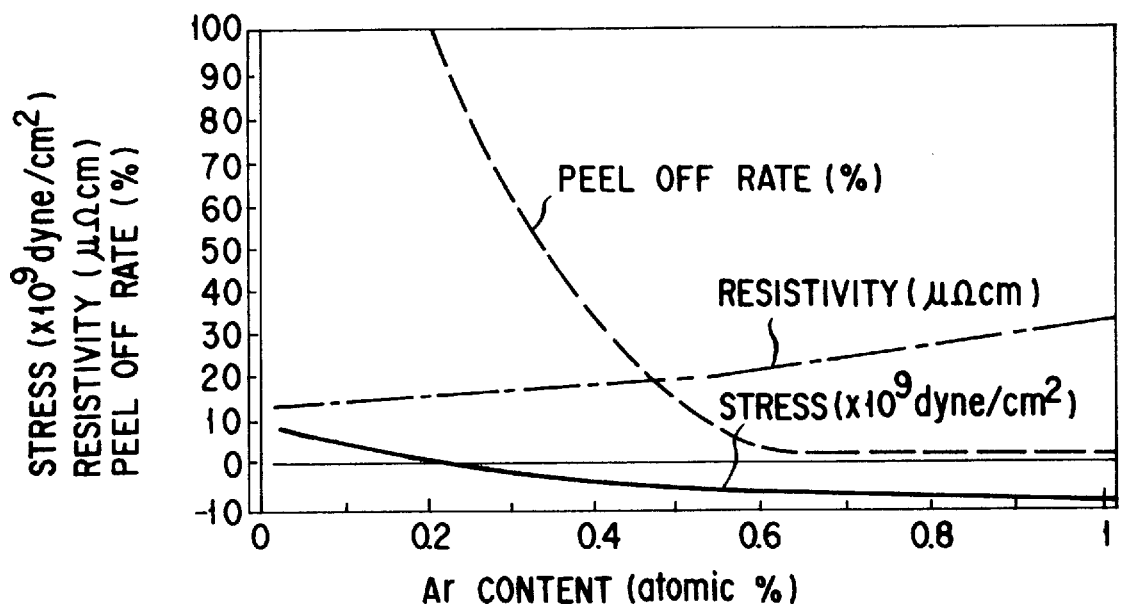
F I G. 21
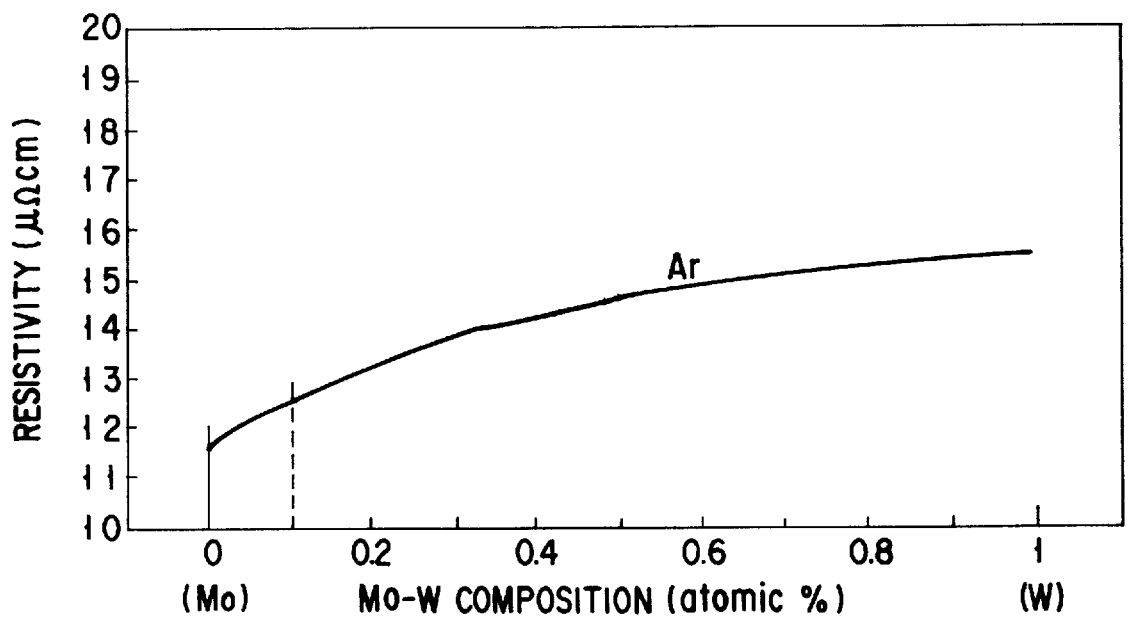
F I G. 22

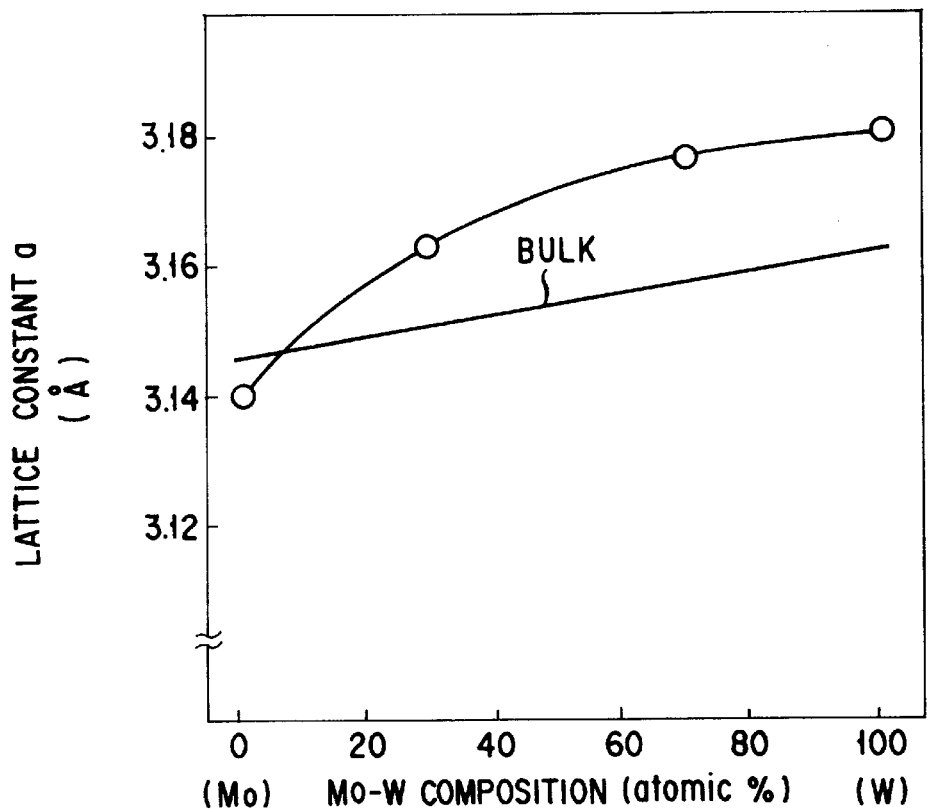
F I G. 23
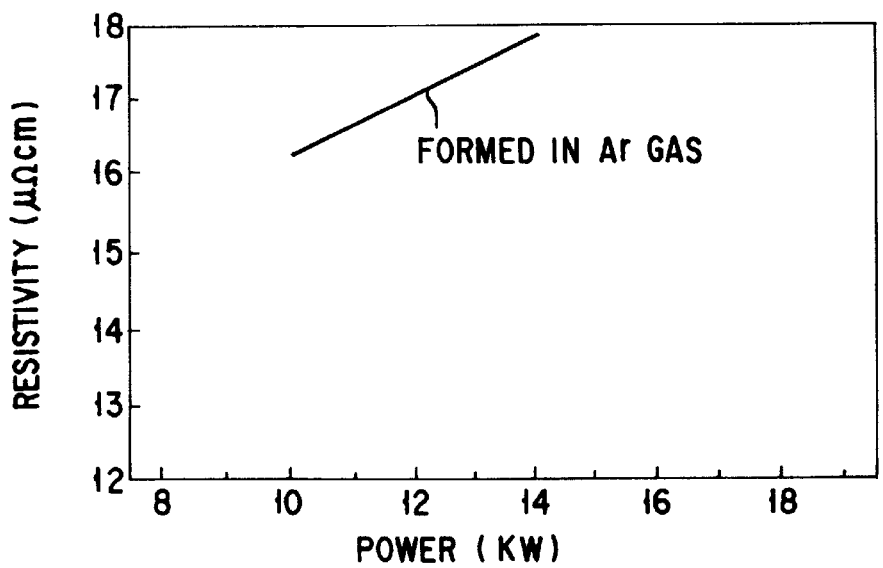
F I G. 24

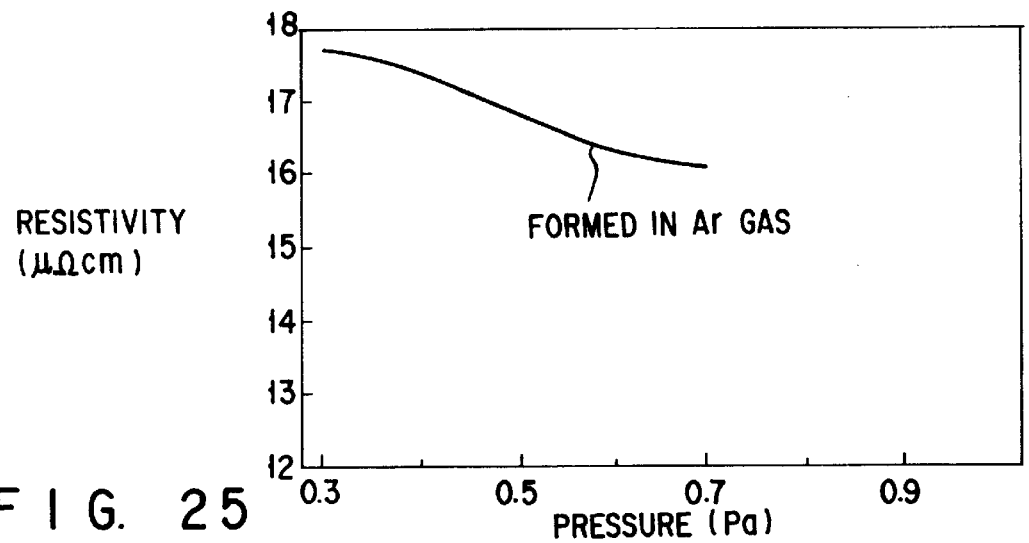
F I G. 25
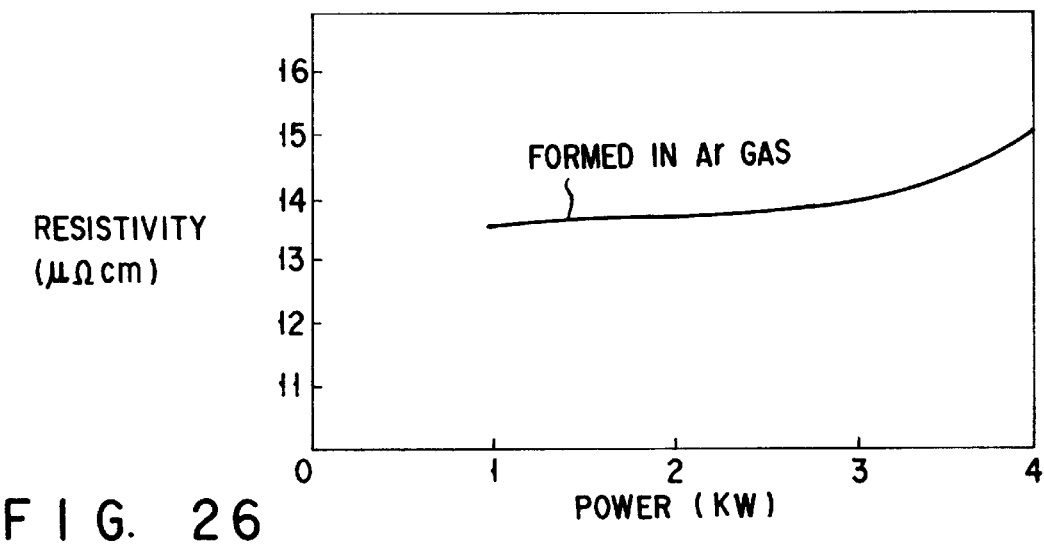
F I G. 26
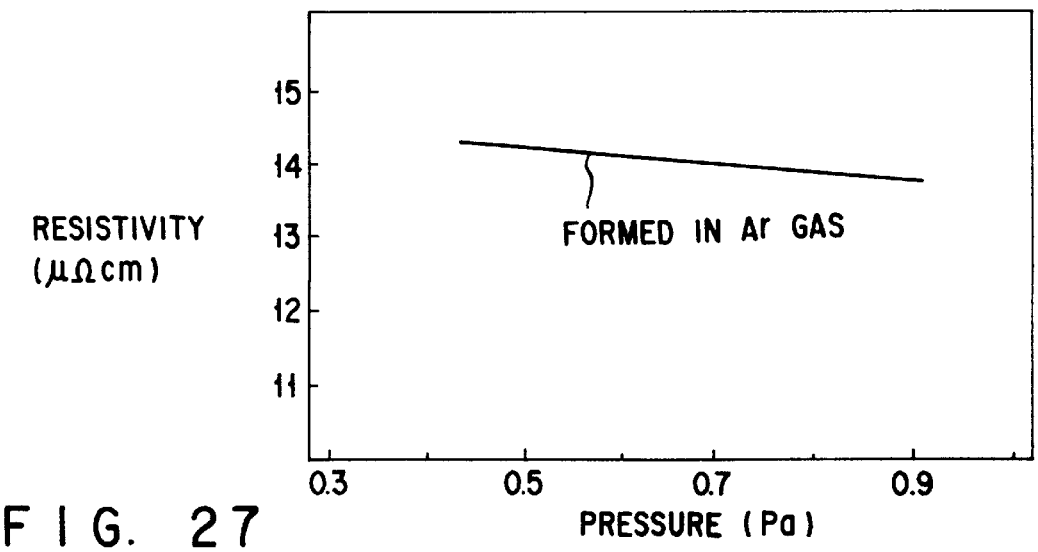
F I G. 27

LIQUID CRYSTAL DISPLAY DEVICE

This application is a Continuation-in-Part of application Ser. No. 08/208,831, filed on Mar. 11, 1994, now abandoned.

BACKGROUND OF THE INVENTION

1. Field of the Invention

The present invention relates to a liquid crystal/display device and, more particularly, to an active matrix type liquid crystal display device.

2. Description of the Related Art

Recently, a great deal of attention has been paid to an active matrix type liquid crystal display element in which a thin-film transistor (to be abbreviated to TFT hereinafter) formed by using an amorphous silicon (to be abbreviated to a-Si hereinafter) film is used as a switching element because there is a possibility of realizing a large-area, high-definition, high-image-quality, inexpensive panel display, i.e., a flat type television set, by forming a TFT array using an a-Si film which can be formed on an inexpensive glass substrate at a low temperature.

In forming a large-area display, however, the total length of address wiring lines greatly increases, and the resistance of the address wiring lines increases. As a result, a gate pulse supplied to each switching element is noticeably delayed due to the resistance of the address wiring lines and capacitances coupled to an address wiring line, and the liquid crystal cannot be properly controlled.

As a means for preventing the delay of a gate pulse while maintaining at least the parameters such as the width of a wiring line, a liquid crystal display device having address wiring lines formed by using a wiring material having a lower resistivity may be developed. More specifically, an Mo—Ta alloy widely used as an address wiring material has a resistivity of about 40 $\mu\Omega$·cm, but it is considered to be difficult to realize a large-area display with the resistivity of this material. Especially for a high-definition, direct-view type display having about 1,000 address wiring lines, a wiring material having a resistivity of about 20 $\mu\Omega$·cm or less is required. In addition to a low resistivity, such a new wiring material is required to allow tapering to improve the step coverage of an insulating interlayer formed on address wiring lines so as to improve the insulating properties between wiring lines formed on the insulating interlayer and the address wiring lines.

That is, demands have arisen for a reliable liquid crystal display device in which the delay of a gate pulse is prevented and good insulating properties are ensured by forming address wiring lines using such a wiring material. Even if this address wiring line is not applied to a large-area display, there is still a merit. That is, as the resistivity of an address wiring line decreases, the width of the wiring line can be reduced to increase the aperture ratio. From this viewpoint, a new wiring material having the above-described characteristics is desirable.

On the other hand, another problem is posed in the conventional liquid crystal display device. FIG. 1 is a sectional view showing a TFT used for the conventional liquid crystal display device. As shown in FIG. 1, a gate electrode 2, an address wiring line, and a Cs line 9 are simultaneously formed on a glass substrate 1 by sputtering an Mo—Ta alloy and patterning. An active layer 4 consisting of a-Si is deposited on the resultant structure on a gate insulating film 3. Thereafter, n$^+$ a-Si layers 5a and 5b are deposited on both sides of the active layer 4. An ITO pixel electrode 8 is formed on the resultant structure on the gate insulating film 3. Subsequently, an Al source electrode 6a having a junction with the n$^+$ a-Si layer 5a, an Al drain electrode 6b having junctions with portions of the n$^+$ a-Si layer 5b and the pixel electrode 8, and a data wiring line are simultaneously formed.

In the TFT shown in FIG. 1, which is used in the conventional liquid crystal display device, since the pixel electrode and the data wiring line are present on the same layer without the mediacy of an insulating film, a short circuit occurs. As a result, a point defect may be produced. In order to prevent such a point defect, an insulating interlayer may be formed after the formation of a source electrode, a drain electrode, which are made of Al usually, and a data wiring line, and a pixel electrode may be formed on the insulating interlayer. However, to realize such a structure, the following requirements must be satisfied:

(1) A data wiring line and the like need to have excellent resistance to HF as an etchant for an insulating interlayer and an ITO etchant for a pixel electrode.

(2) A data wiring needs to allow tapering to improve the step coverage of an insulating interlayer so as to improve the insulating properties between the data wiring line and a pixel electrode.

However, there is no known wiring material for data wiring lines that can satisfy these requirements, and hence it is difficult to realize such a structure and improve the reliability of a liquid crystal display device. Especially, in developing a large-area display, it is important to reduce the rate of occurrence of point defects, and the development of such a highly reliable liquid crystal display device is demanded.

In addition, if an Al or Ta alloy is used as material of data wiring lines, an oxide film is formed on the surface of the alloy, resulting in an increase in contact resistance with respect to a metal wiring line as an upper layer. For this reason, the step of removing such an oxide film is required. This step is also required for a contact of a gate wiring line layer 10a and a data wiring line metal layer 10b, i.e., a wiring extraction contact portion in the conventional structure shown in FIG. 1. Furthermore, a barrier metal such as Mo is required to prevent a reaction between ITO and Al, increasing the number of steps.

In addition, if an Al alloy, which has a very high reflectance, is used as data wiring line material, disconnection due to underlayer dust and thinning of a pattern and the like may occur by the exposure light reflection in the photolithographic process, resulting in line defects. Another drawback is posed because of the high reflectance. That is, when stray light such as light reflected by the opposing substrates is rereflected by wiring lines to be radiated on TFTs, a light leakage current may be produced, reducing the contrast in a display operation of the panel due to signal voltage decrease on the pixel.

As described above, in an attempt to realize an active matrix type liquid crystal display device having a large display area, the resistance of address wiring lines increases to cause a noticeable delay of a gate pulse. As a result, the liquid crystal cannot be properly controlled.

SUMMARY OF THE INVENTION

The present invention has been made in consideration of the above situation, and has as its object to provide a liquid crystal display device in which a gate pulse is free from a delay, and a high breakdown voltage is ensured with respect to address lines.

The object is accomplished by a liquid crystal display device comprising a plurality of address wiring lines made of an Mo—W alloy, a plurality of data wiring lines intersecting the address wiring lines, with insulating films interposed at intersection portions of data wiring lines and the address wiring lines pixel electrodes arranged respectively for the intersection portions, and a plurality of switching elements, each arranged to be adjacent to a corresponding one of the intersection portions and having a control electrode electrically connected to a corresponding one of the address wiring lines, a first main electrode electrically connected to a corresponding one of the data wiring lines, and a second main electrode electrically connected to a corresponding one of the pixel electrodes.

According to the present invention, since an Mo—W alloy has a low resistivity, an address wiring line formed by using this material serves as a low-resistance component with respect to a gate pulse. Therefore, a gate pulse transferred through this address wiring line is free from a delaying effect due to the wiring resistance of the address wiring line. Hence, a gate pulse without a delay can be supplied to a predetermined switching element for driving a liquid crystal.

In this case, since an Mo—W alloy can be tapered, an insulating interlayer formed on address wiring lines formed by using this material exhibits good step coverage. For this reason, a high breakdown voltage can be ensured between the address wiring lines and other wiring lines formed on the insulating interlayer. Therefore, a reliable liquid crystal display device having a large display area can be realized.

In addition, even if this address wiring line is not applied to a large-area display, there is still a merit. That is, as the resistivity of an address wiring line decreases, the width of the wiring line can be reduced, and hence the opening ratio can be increased. Furthermore, since the resistance of an oxide film formed on the surface of each address wiring line is low, no surface layer removal process is required. By using an Mo—W alloy as a signal wiring line or source electrode, no barrier metal is necessary, because good electric contact is obtained. Also, the TFT leakage current is decreased, because light reflection is reduced by small reflectance of the Mo—W alloy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a cross-sectional view showing a TFT and a storage capacitance portion used in an example of an LCD device according to a first embodiment of the present invention;

FIG. 3 and FIG. 16 are graphs showing the relationship between a resistivity of a Mo—W alloy and a W atm % content;

FIGS. 7, 8 and 11 are cross-sectional views showing TFTs and storage capacitance portions used in other examples of the LCD device according to the first embodiment of the present invention;

FIG. 12 is a cross-sectional view showing the structure of a film obtained by an ordinary method;

FIG. 13 is a cross-sectional view showing an LCD device according to a second embodiment of the invention;

FIG. 14 is a cross-sectional view showing the state in which the LCD device shown in FIG. 13 has been subjected to a tapering process;

FIG. 15 is a cross-sectional view showing a TFT and a storage capacitance portion used in an example of an LCD device according to a third embodiment of the invention;

FIG. 17 is a cross-sectional view showing a TFT and a storage capacitance portion used in an another example of the LCD device according to the third embodiment of the invention;

FIG. 18 is a cross-sectional view showing an LCD device according to a fourth embodiment of the invention;

FIG. 19 is a graph showing the relationship between a reflectance of the Mo—W alloy and the W % content; and FIG. 20 is a plan view showing a driving circuit board of the LCD device according to the fourth embodiment of the invention; and FIG. 21 is a characteristic diagram illustrating the relationship between the stress, resistivity and film peeling rate, and the Ar amount of the film;

FIG. 22 is a characteristic diagram illustrating the relationship between the resistivity and the Mo content;

FIG. 23 is a characteristic diagram illustrating the relationship between the lattice constant measured by X-rays and the Mo content;

FIG. 24 is a characteristic diagram illustrating the relationship between the resistivity and the power;

FIG. 25 is a characteristic diagram illustrating the relationship between the resistivity and the pressure;

FIG. 26 is a further characteristic diagram illustrating the relationship between the resistivity and power;

FIG. 27 is a further characteristic diagram illustrating the relationship between the resistivity and the pressure;

DETAILED DESCRIPTION OF THE PREFERRED EMBODIMENTS

Figure 1:
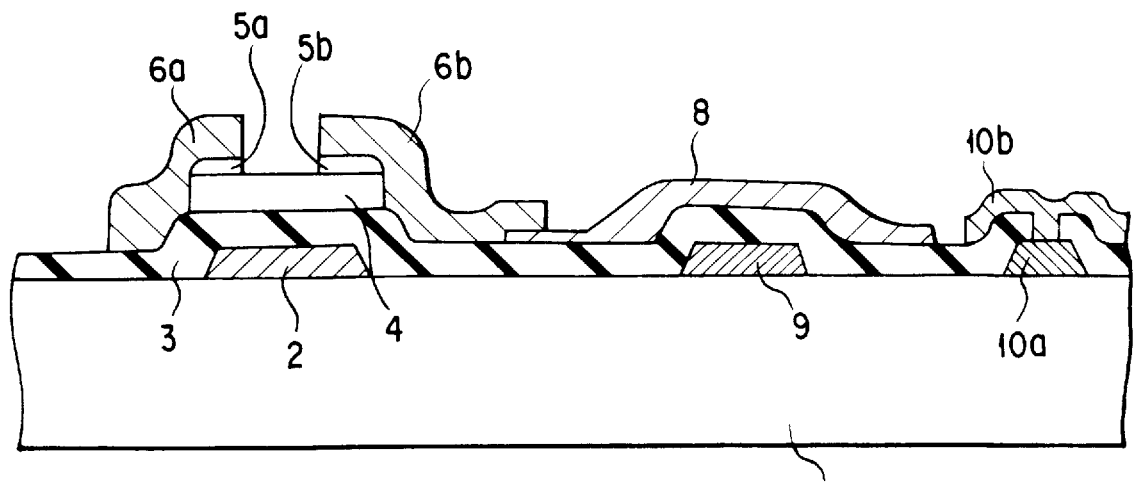
FIG. 1 is a cross-sectional view showing a TFT and a storage capacitance portion used in a conventional liquid crystal display (LCD) device.

Embodiments of the present invention will be described below with reference to the accompanying drawings. Note that the same reference numerals denote the same parts throughout the embodiments, and a detailed description thereof will be omitted for the sake of simplicity.

EMBODIMENT 1

(Example 1)

FIG. 2 is a sectional view showing a TFT (switching element) and a capacitor portion which are used for one example of a liquid crystal display device according to the embodiment 1 of the present invention. The arrangement and manufacturing process of the TFT and the capacitor portion will be described below. A gate electrode (control electrode) 12, an address wiring line, and a Cs line 19 are simultaneously formed on a glass substrate 11 by sputtering an Mo—W alloy or Mo—Cr alloy to a thickness of 300 nm and patterning. Thereafter, a 350-nm thick oxide film 13, a 300-nm thick active layer consisting of a-Si, and 50-nm thick n$^+$ a-Si layers 15a and 15b are continuously formed on the resultant structure by plasma CVD, thus forming an island-shaped a-Si active layer 14. ITO is then sputtered to a thickness of 120 nm to form a pixel electrode 18. SiO$_x$ of a contact portion 20 is etched by using buffered HF to form a contact hole. A source electrode (first main electrode) 16a, a drain electrode (second main electrode) 16b, a data wiring line, and a contact electrode 21 are simultaneously formed on the resultant structure by sputtering a predetermined wiring metal such as Al and performing wet etching. At this time, an oxide film on the surface of address wiring line electrode of the contact portion needs to be removed before Al or the like is sputtered.

Figure 3:
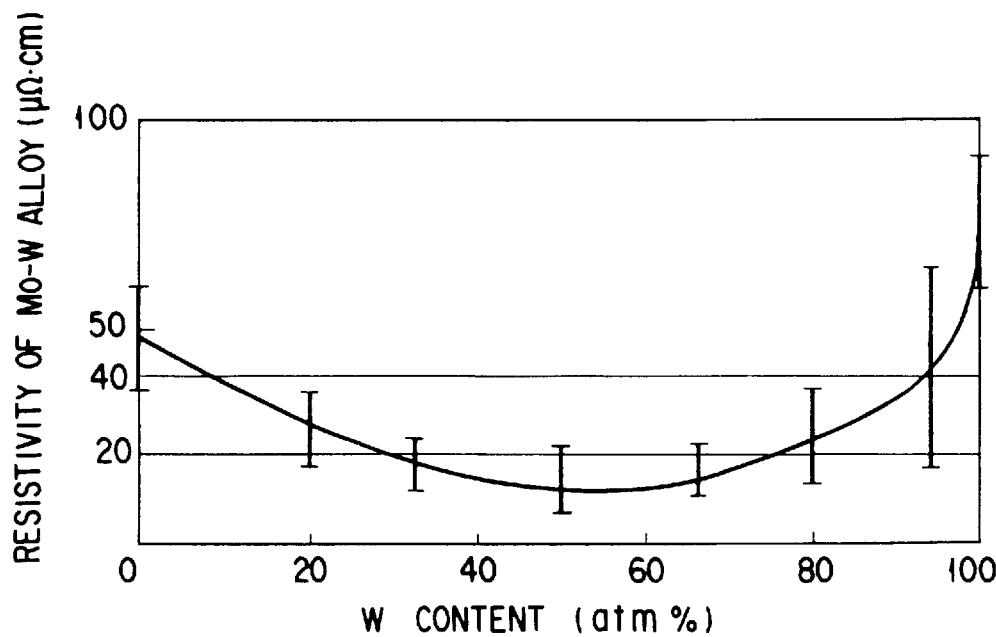

According to tests performed by the present inventors by using a sputtering apparatus whose ultimate degree of vacuum was low, it was found, as shown in FIG. 3, that the resistivity of an Mo—W alloy was much lower than 40 $\mu\Omega$·cm (VGA level) and the resistance thereof was below that of Mo or W as a single element with a W content of the Mo—W alloy falling within a preferable range of 10 to 95 atm %, and a more preferable range of 20 to 90 atm %. The resistivity of an Mo—W alloy falling within a range of 30 to 70 atm % was much lower than 20 $\mu\Omega$·cm. The address wiring line alloy for use in a 10-inch XGA display (768 columns, 1024 rows) needs to have a resistivity of 20 $\mu\Omega$·cm or less.

In addition, it was found that an address wiring line formed by using an Mo—W alloy could be tapered by CDE using a gas mixture of CF$_4$ and O$_2$. It was also found that the address wiring line could be tapered, without degrading a resist, by a wet etching method using an alkaline etchant (pH of 7 to 13) containing an oxidizing agent having a redox potential higher than that of Mo and W and lower than that of Ti.

According to the present invention, since an Mo—W alloy has a low resistivity, an address wiring line formed by using this material exhibits a low resistance. For this reason, no gate pulse delay is caused by the wiring resistance, and a gate pulse without a delay can be supplied to a predetermined switching element. Since an Mo—W alloy can be tapered, an insulating interlayer formed on address wiring lines formed by using this material exhibits good step coverage, thereby ensuring a high breakdown voltage. Therefore, a reliable liquid crystal display device having a large display area can be realized. Note that even if this address wiring line is not applied to a large-area display, there is still a merit. That is, as the resistivity of an address wiring line decreases, the width of the wiring line can be reduced, and hence the aperture ratio can be increased.

Figure 4:
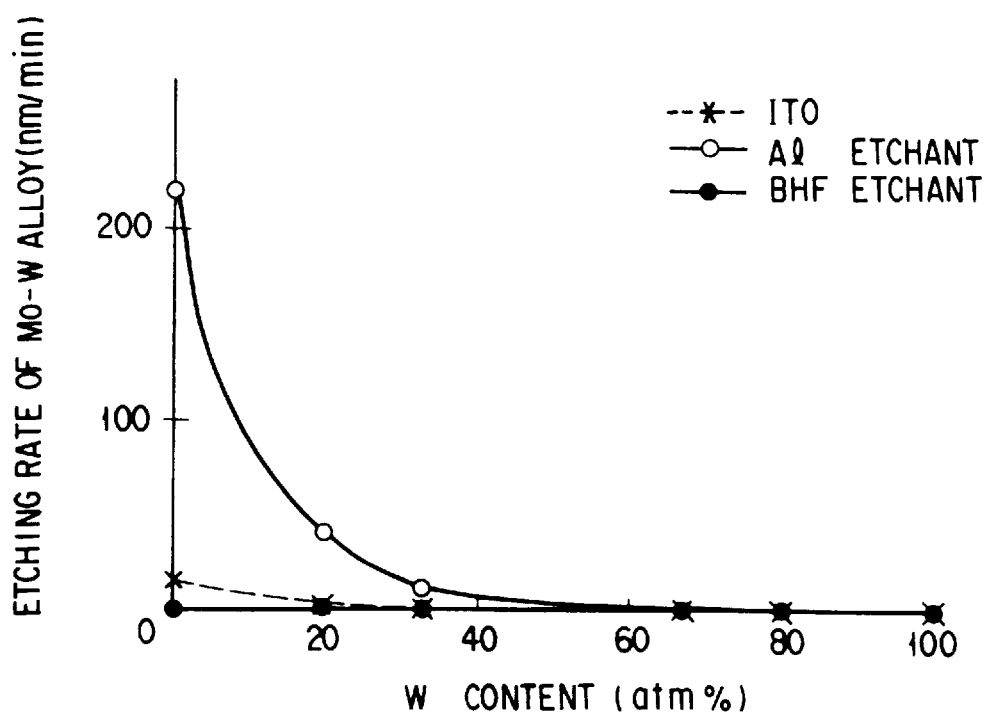
FIG. 4 is a graph showing the relationship between an etching rate of the Mo—W alloy, with respect to each of etchants, and the W atm % content.
Figure 5:
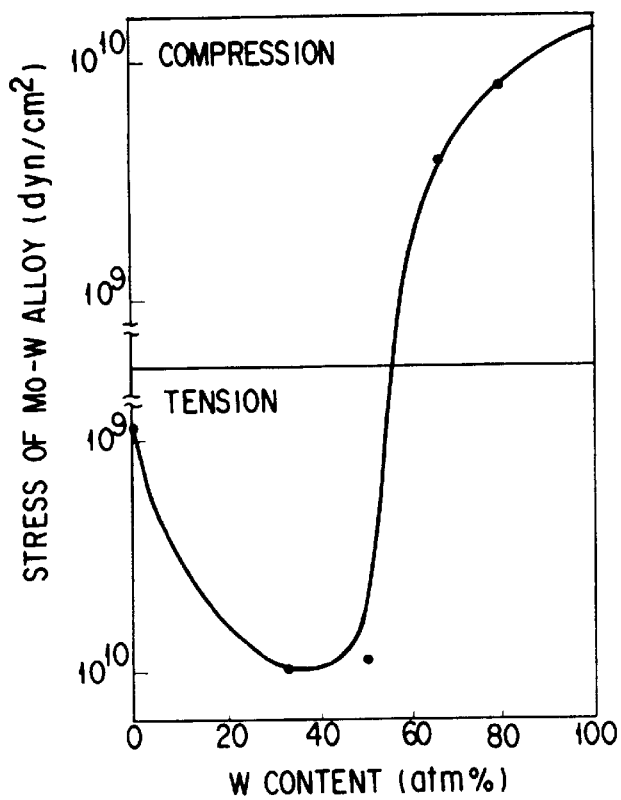
FIG. 5 and FIG. 6 are graphs showing the stress of the Mo—W alloy and the W atm % content.

According to tests performed by the present inventors, it was found, as shown in FIG. 4, that an Mo—W alloy exhibited excellent chemical resistance when the W content was 20 atm % (atomic %) or more, and more preferably 25 atm % or more. More specifically, it was found that the etching rate of the Mo—W alloy was 10 nm/min or less with an ITO etchant for a pixel electrode material; the Mo—W alloy was not etched at all by BHF as an etchant for an insulating interlayer; and the etching rate of the Mo—W alloy was 30 to 40 nm/min or less even with an Al etching. Especially, it was found that when the W content was 50 atm % or more, the Mo—W alloy was not etched at all. Even if, therefore, a pin hole is formed in the insulating interlayer, wiring lines under the insulating interlayer, such as gate electrodes and data wiring lines, are not corroded by the above etchants. For this reason, the degree of freedom in structure design/process design above the insulating interlayer can be increased. In addition, as shown in FIG. 5, since the stress greatly changes depending on a W composition ratio, a reduction in stress can be achieved by adjusting the W composition ratio.

On the other hand, it was found that the stress was reduced when an Mo—W alloy contained 0.5 atm % or more of O and/or N, but the resistance was increased when the alloy contained 10 atm % or more of O and/or N.

Figure 6:
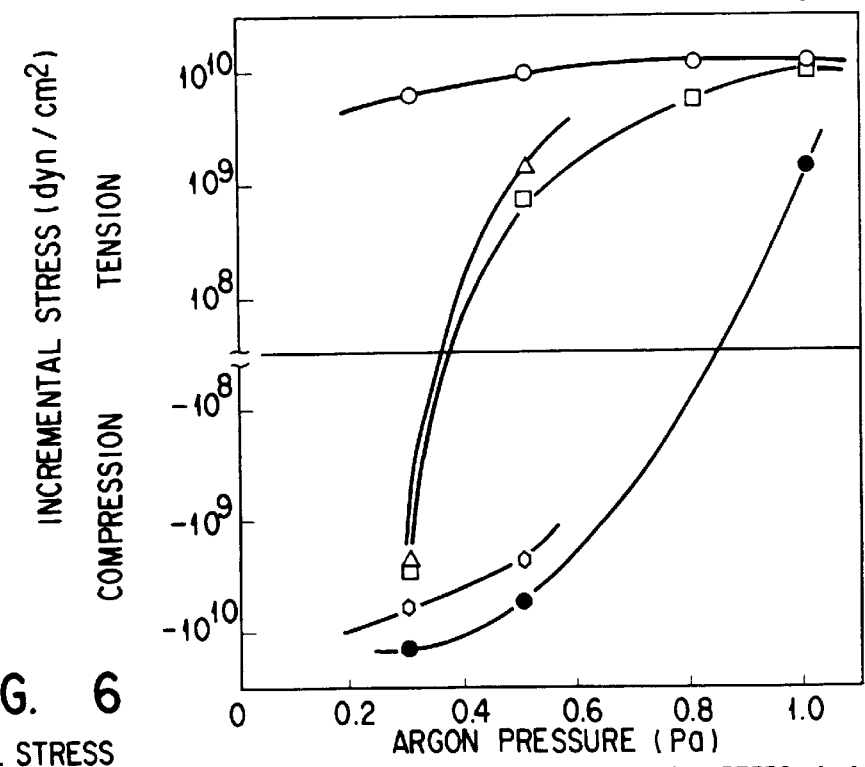

FIG. 6 shows a change in stress measured under different sputtering conditions. As is apparent, the stress greatly changes depending on an Mo/W composition ratio and sputtering conditions (discharging pressure and discharging power). It was found from analysis that this change in stress was due to the Ar content of the film. That is, the stress is reduced when the film contains 0.1 atm % or more of Ar, and the grain size decreased by the crystal growth disturbance and the film resistance increases when the film contains 2 atm % or more of Ar. The same holds true of an inert gas (He, Ne, Kr, or Xe gas) other than Ar, and there is no problem unless the Ar content exceeds 10 atm %.

When a device is to be formed on a glass substrate or a transparent insulating film on a glass substrate, the adhesion property of a film is important. When 0.5 atm % or more of Cr and/or Ti are contained in an Mo—W alloy, the adhesion property of the alloy with respect to an underlying layer is improved, and the alloy can be etched by a gas mixture of CF$_4$ and O$_2$, and good taper can be formed. However, when 10 atm % or more of Cr and/or Ti are contained in an Mo—W alloy, the etching workability of the alloy is degraded, and the resistance is increased.

Stacking of an Mo—W alloy nitride and an Mo—W alloy is also effective in improving the adhesion property with respect to an underlying layer. If 50 atm % or more of N are contained in an Mo—W alloy, the resistance of the alloy abruptly increases. Therefore, the N content of the alloy must be 50 atm % or less. A TiN alloy film also improves the adhesion of the Mo—W film.

It was found when an Mo—W alloy, especially an Mo—W alloy containing 50 atm % or more of W, was annealed in the air for a long time, the resistivity increased 10 times or more. This increase in resistivity was caused by excessive oxidation on the surface of the alloy. However, when an Mo—W alloy nitride film was stacked on the Mo—W alloy film, oxidation was prevented and no increase in resistance occurred. That is, a wiring line which is resistant to oxidation, which can be tapered and which has a low resistance can be formed in the same process as that for an Mo—W alloy by sputtering an Mo—W alloy, sputtering an Mo—W alloy nitride containing 50 atm % or less of N, and dry etching the resultant structure with a gas mixture of $CF_4$ and $O_2$ and good taper can be formed. An Mo—W alloy containing 50 atm % or less of N may be formed on the substrate to improve the adhesion of the Mo—W alloy film to the substrate. Such an Mo—W alloy may also be used as an underlayer for a TaN alloy film to attain the same advantage. The surface coverage by a film made of TaN, TaNbN, TaWN or TaMoN alloy has the same effect as the MoWN alloy film.

According to tests performed by the present inventors, it was found that the above description of the Mo—W alloys also applied to Cr—W alloys. When an address wiring line or the like is formed by using this material, the same effects as those described above can be obtained.

The above manufacturing process is only an example, and the thickness of each layer, the film formation methods, and the like can be modified as needed. Even in such a case, the same effects as those of the embodiment can be obtained. In addition, a TFT having a structure different from that of the above TFT may be used. For example, a TFT having an insulating film as a stopper formed on an a-Si channel may be used. Furthermore, a TFT having a capacitor portion which is constituted by the same wiring layer as that of a gate electrode and the same wiring layer as that of a data wiring line may be used.

(Example 2)

Figure 7:
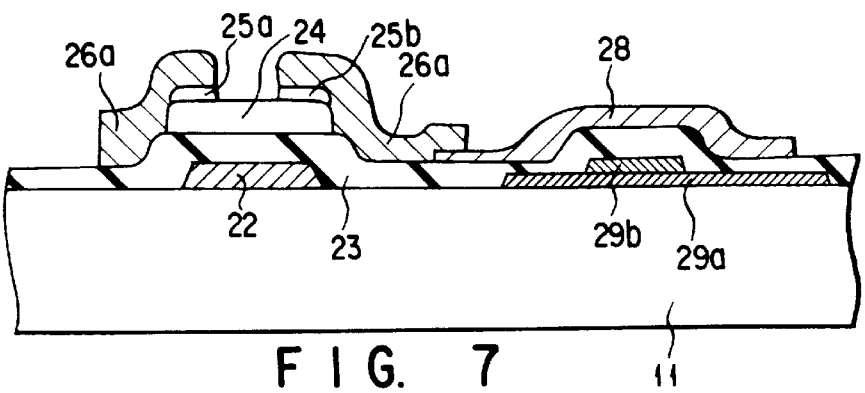

FIG. 7 is a sectional view showing a TFT and a capacitor portion which are used for other example of liquid crystal display device according to the embodiment 1 of the present invention. The arrangement and manufacturing process of the TFT and the capacitor portion will be described below. A Cs line 29a is formed on a glass substrate 11 by sputtering ITO to a thickness of 120 nm and patterning. Thereafter, a gate electrode 22, an address wiring line, and a Cs line 29b are simultaneously formed by sputtering Mo—W to a thickness of 300 nm and patterning. A 350-nm thick silicon oxide or silicon nitride film 23, a 300-nm thick a-Si layer, and 50-nm thick $n^+$ a-Si layers 25a and 25b are successively formed on the resultant structure by plasma CVD, thus forming an island-shaped a-Si active layer 24. A pixel electrode 28 is then formed by sputtering ITO to a thickness of 120 nm. A contact hole is formed by using an HF solution. A source electrode 26a, a drain electrode 26b, and a data wiring line are simultaneously formed by sputtering a predetermined wiring metal such as Al and performing wet etching. In this structure, since a capacitor portion is formed between the transparent ITO Cs line 29a and the pixel electrode 28 and both the line 29a and the electrode 28 are transparent, the Cs line portion, which cannot be used as an aperture portion in the prior art, can be used as an aperture portion. Therefore, the aperture ratio can be increased. Although the resistivity of ITO is higher than that of a metal, the resistivity of the Cs line 29a can be sufficiently reduced by stacking the Cs line 29b on the Cs line 29a. At this time, the ITO can contact the Mo—W alloy without a barrier metal.

(Example 3)

Figure 8:
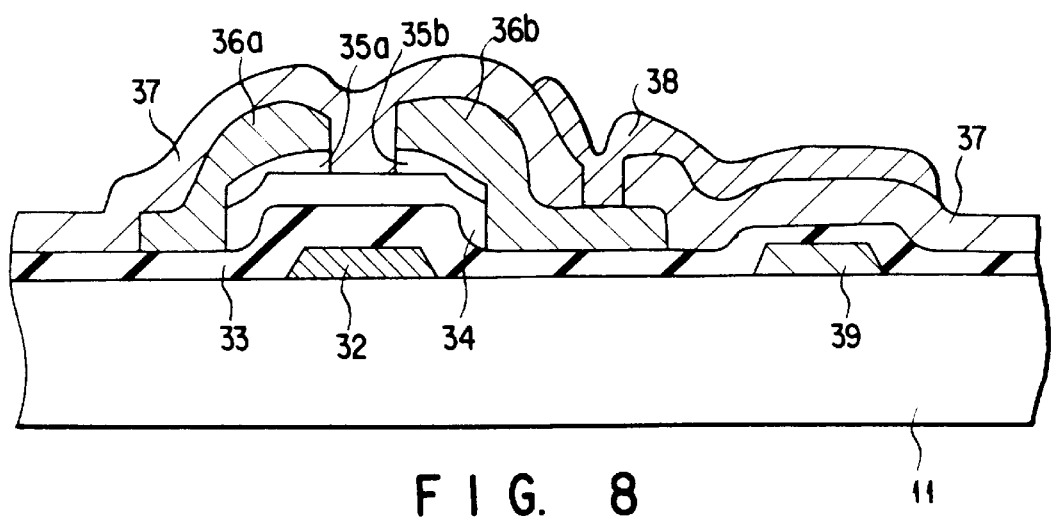

FIG. 8 is a sectional view showing a TFT and a capacitor portion which are used for other example of a liquid crystal display device according to the embodiment 1 of the present invention. The arrangement and manufacturing process of the TFT and the capacitor portion will be described. A gate electrode 32, an address wiring line, and a Cs line 39 are simultaneously formed on a glass substrate 11 by sputtering a predetermined wiring material such as a Mo—Ta alloy to a thickness of 300 nm and patterning. Thereafter, a 350-nm thick oxide or nitride film 33, a 300-nm thick a-Si layer, and 50-nm thick $n^+$ a-Si layers 35a and 35b are successively formed on the resultant structure by plasma CVD, thus forming an island-shaped a-Si active layer 34. A contact hole is formed by etching SiOx of a contact portion using diluted HF. An oxide film on the surface of the a-Si active layer 24 is then removed. Subsequently, a source electrode 36a, a drain electrode 36b, and a data wiring line are formed by sputtering an Mo—Ti alloy, a W—Ti alloy, or an Mo—W alloy and performing wet etching. A 300-nm thick oxide film 37 is formed on the resultant structure. A contact hole is formed on the drain electrode 36b by an etching method using an HF solution (for example, an etching rate of about 100 nm/min) or a dry etching method (for example, an etching rate of about 30 to 100 nm/min) using a gas such as $CF_4$. In addition, a 120-nm thick ITO is sputtered to form a pixel electrode 38.

Figure 9:
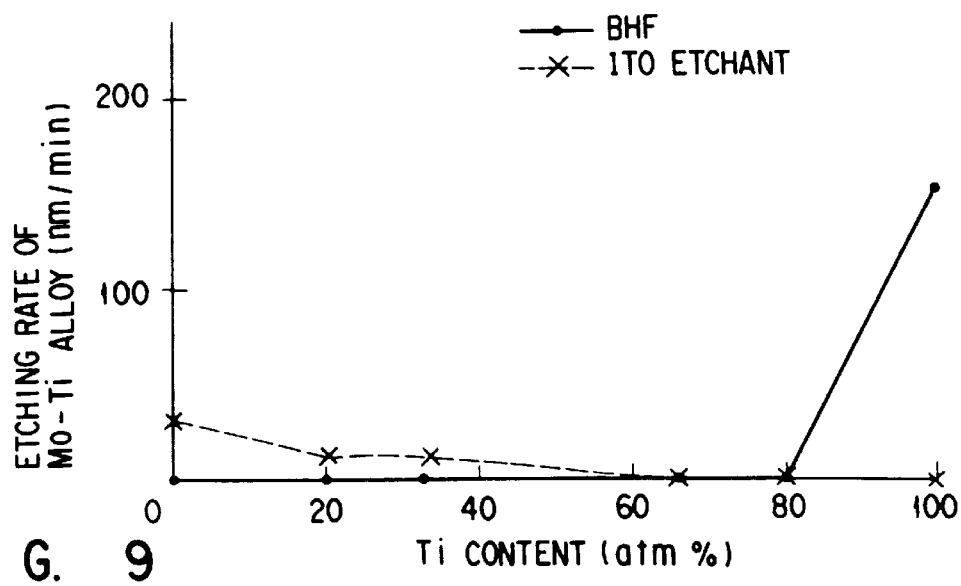
FIG. 9 is a graph showing the relationship between an etching rate of a Mo—Ti alloy, with respect to each of etchants, and a Ti atm % content.

According to etching tests performed by the present inventors, as shown in FIG. 9, it was found that an Mo—Ti alloy exhibited excellent chemical resistance with respect to an ITO etchant used to form the pixel electrode 38 and BHF used to form a contact hole when a Ti content was 20 to 80 atm %. In addition, it was found that the Mo—Ti alloy can be etched, without dissolving a resist, by using a weak alkaline etchant (pH of 7 to 13) containing an oxidizing agent having a redox potential higher than that of Ti.

Figure 10A:
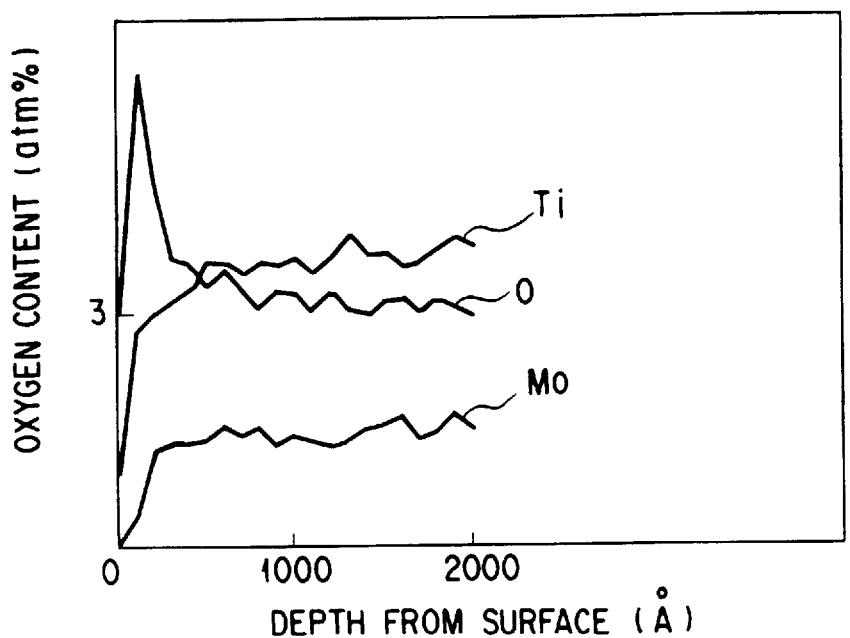
FIGS. 10A and 10B are graphs illustrating the relationship between an oxygen content of the Mo—Ti alloy and the tapering workability.
Figure 10B:
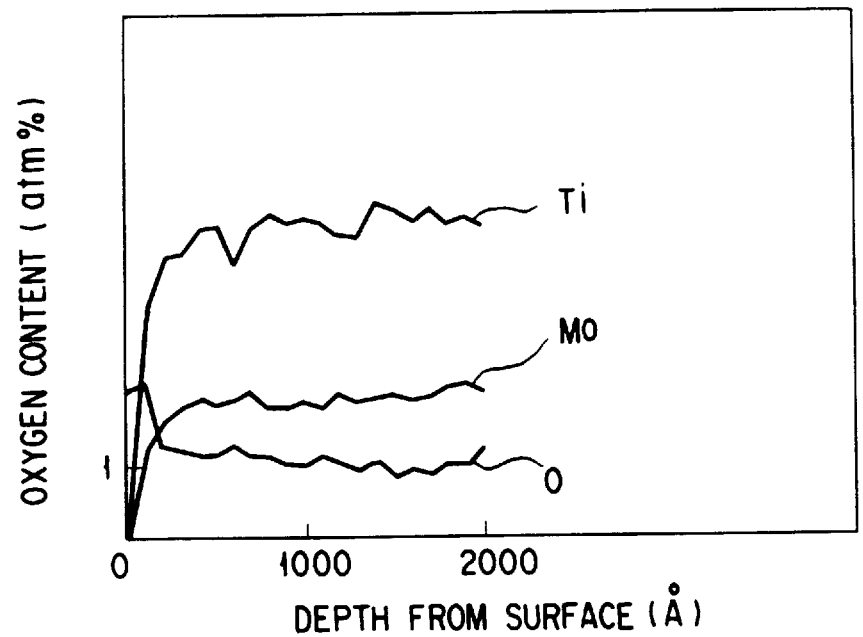

Films formed by using Mo—Ti alloys having different oxygen contents were etched. The oxygen contents of films which were tapered and those of films which were not tapered were checked by using an Auger analysis method. FIGS. 10A and 10B show the results. Although the ordinates in FIGS. 10A and 10B, along which Mo, Ti, and O (oxygen) contents are plotted, have difference scales, the abscissas in the same drawings, along which Mo, Ti, and O (oxygen) contents are plotted, have the same scale. FIG. 10A indicates that the oxygen content of an Mo—Ti alloy is about 3 atm % when tapering can be performed. FIG. 10B indicates that the oxygen content of an Mo—Ti alloy is about 1 atm % when tapering cannot be performed. From the results of these tests, it was found that tapering could be performed when the oxygen content of an Mo—Ti alloy was about 2 atm % or more. In addition, it was found that when the oxygen content of an Mo—Ti alloy exceeded about 8 atm %, the resistivity increased, and hence the alloy could not be used as a wiring material. It was, therefore, found that the oxygen content of an Mo—Ti alloy used as a wiring material was preferably 8 atm % or less, and more preferably fell in the range of 2 to 5 atm %, in consideration of limitations associated with taper workability and resistivity.

It is, therefore, preferable that the source electrode 36a, the drain electrode 36b, and the data line be formed by sputtering an Mo—Ti alloy having a Ti content of 20 to 80 atm % and an O (oxygen) content of 8 atm % or less, and preferably 2 to 5 atm %, and performing wet etching. In this case, since the data wiring line can be tapered, an insulating interlayer formed on data wiring lines formed by using this material exhibits good step coverage, thus ensuring a high breakdown voltage. In addition, since an Mo—Ti alloy exhibits good chemical resistance with respect to an ITO etchant used to form the pixel electrode 38 and BHF used to form a contact hole, the chemical resistance of the drain electrode 36b is good, and a contact hole is formed on the drain electrode 36b by using HF. Furthermore, a pixel electrode can be etched by using a solution mixture of hydrochloric acid and nitric acid. For this reason, unlike the conventional structure shown in FIG. 1, the structure shown in FIG. 8, in which the pixel electrode 38 is formed on the data wiring line through the oxide film 37, can be employed to reduce point defects.

According to tests performed by the present inventors, it was found that the same applied to a case wherein a W—Ti alloy was used. The same effects as those described above can be obtained in a case wherein a data wiring line and the like are formed by using this material.

As described above, an Mo—W alloy exhibits excellent chemical resistance when the W content is 20 atm % or more, and preferably 25 atm % or more. In addition, a data wiring line formed by using this material can be tapered, without degrading a resist, by using an alkaline etchant (pH of 7 to 13) containing an oxidizing agent having a redox potential higher than that of Mo and W and lower than that of Ti or by using $CF_4/O_2$ gas dry etchant.

Therefore, similar to the cases wherein an Mo—Ti alloy and a W—Ti alloy are used, in a pixel array formed in this manner, since each data wiring line is tapered, the step coverage of an insulating interlayer formed thereon is good, ensuring a high breakdown voltage. In addition, since the drain electrode 36b has good chemical resistance, a contact hole can be formed on the drain electrode 36b by using HF. Furthermore, a pixel electrode can be processed by a solution mixture of hydrochloric acid and nitric acid. As described above, since the stress greatly changes depending on a W composition ratio, the stress can be reduced, and a low-resistant wiring line can be realized.

It was found that when a wiring line was formed by using an alloy of this example, no hillock was produced unlike an Al wiring line. It was also found that no barrier metal was required because no reaction occurred between the alloy and ITO. In addition, since the alloy has a low reflectance of about 40 to 60% as compared with Al, the rate of occurrence of disconnection due to underlying dust and the like and thinning of a pattern in the photolithographic process are reduced, and line defects are reduced, thus increasing the yield. In order to prevent a reduction in yield in the photolithographic process, photolithography may be performed after a low-reflectance film such as an Mo film is stacked on an Al layer. However, with the use of an Mo—W alloy, the yield can be increased without stacking such a film because of low reflectance. Furthermore, the use of this alloy reduces the amount of re-reflected stray light among wiring lines, such as light reflected by the opposing substrates, which is one of the factors that produce a light leakage current in a TFT. Therefore, the contrast of a panel using this alloy in a display operation can be improved by decreasing the pixel signal voltage as compared with a panel using Al wiring lines.

The above manufacturing process is only an example, and the thickness of each layer, the film formation methods, and the like can be modified as needed. Even in such a case, the same effects as those of the embodiment can be obtained. In addition, a TFT having a structure different from that of the above TFT may be used. For example, a TFT having an insulating film as a stopper formed on a channel may be used. Furthermore, a TFT having a capacitor portion which is constituted by the same wiring layer as that of a gate electrode and the same wiring layer as that of a data wiring line may be used.

(Example 4)

FIG. 11 is a sectional view showing other example of a liquid crystal display device according to the embodiment 1 of the present invention. This liquid crystal display device is an active matrix type liquid crystal display device which has address wiring lines and the like formed by using an Mo—W or Mo—Cr alloy as in the example 1, and also has data wiring lines formed by using an Mo—Ti, W—Ti, or Mo—W alloy as in the example 3. The device uses a TFT having an insulating film as a stopper formed on a channel in place of the TFT used in the above examples, which is a back channel cut type TFT in which a channel portion is etched. In addition, a capacitor portion is formed by using the same wiring layer as that of a gate electrode and the same wiring layer as that of a data wiring line.

As has been described above, a gate electrode 42, an address wiring line, and a Cs line 49a are simultaneously formed on a glass substrate 11 by using the above wiring metal. Thereafter, an insulating interlayer 43, an a-Si active layer 44, a channel protective film 50, and $n^+$ a-Si layers 45a and 45b are continuously formed. A source electrode 46a, a drain electrode 46b, a data wiring line, and a Cs line 49b are continuously formed on the resultant structure by using the above wiring metal. Subsequently, an oxide film 47 is formed, and a contact hole is formed on the drain electrode 46b. In addition, a pixel electrode 48 is formed. In this example, the effects in both example 1 and example 3 can be obtained at once. A detailed description of the effects will be omitted for the sake of simplicity.

The present invention is not limited to the embodiment 1 described above. The semiconductor used in the present invention is not limited to a-Si, and p-Si and CdSe may be used. In addition, the insulating film on the data wiring line is not limited to an oxide film, and a nitride film may be used.

Furthermore, the alloy film used in each example described above is not limited to a single-layered structure. Instead of using such a film, a multilayered film constituted by two or more layers made of alloys having difference compositions may be used. For example, a stacked film consisting of a film made of a material containing Mo and W, as main components, and nitrogen and a film made of an Mo—W alloy may be used so that Mo and W may prevent surface oxidation. When an Mo—W—N alloy is formed on the Mo—W wiring line, the oxidation resistance can be improved and the Mo—W—N alloy formed under the Mo—W alloy, adhesion can be improved. In addition, a metal layer consisting of Ta, TaN, TaNbN, TaMoN, TaWN, or the like, or a layer made of an alloy of these metals may be formed on the surface of the above alloy film, i.e., formed as an upper layer, to improve the acid resistance. Moreover, an Al film, a Cu film, an Au film or the like may be stacked as a lower layer of the above Mo—W alloy film to decrease the resistance, as shown in FIG. 12.

The present invention is not limited to the above embodiments. Various changes and modifications can be made without departing from the spirit and scope of the invention.

The importance of the structure of the liquid crystal display device according to the present invention will now be described.

In a liquid crystal display device using a TFT, the wiring resistance needs to be lower, as the screen size and screen resolution increase. For example, in a VGA display for a personal computer, the number of wires is 480×(640×3). In an XGA display for a high-grade personal computer, the number of wires is 760×(1024×3). The wiring resistance needs to be low in order to prevent delay of gate pulses. The pulse delay is determined by a product CR of a wiring resistance R and a capacitance C consisting of a TFT capacitance signal wiring line cross part capacitance and others. If the screen size increases, the length of wiring line increases and inevitably the resistance R increases. As a result, CR increases. If the number of pixels increases, the capacitance C ($C=C_0 \times n$; $C_0$: capacitance of unit pixel, n: number of pixels) increases and accordingly the product CR increases. Since C is determined by the pixels structure which uniquely determines display quality, the resistance R must be decreased in order to prevent the pulse delay.

In an ordinary design method, the VGA of ordinary design having a 10-inch screen or a larger screen needs to have a resistivity of 40 $\mu\Omega$·cm or less, and the XGA a resistivity of 20 $\mu\Omega$·cm or less. Thus, as a wiring material of the VGA, MoTa alloy or Cr having a resistivity of about 40 $\mu\Omega$·cm can be used. However, in the XGA, neither MoTa nor Cr can be used. This being the case, the XGA normally adopts a structure, as shown in FIG. 12, wherein the surface of a low-resistance Al is coated with Ta having good acid-proof properties. The reason why such a complex structure is adopted is that Al has a low resistivity of about 4 $\mu\Omega$·cm or less but has low acid-resistance and therefore it may be eroded by an Al etchant or ITO etchant. Since the structure shown in FIG. 12 is complex, the manufacturing cost increases and the inside Al is eroded, causing a line defect or a point defect. These defects are inevitable, because Ta pinhole by the dust is inevitable, which causes erosion of bare Al wiring line. If Cu or Mo is used instead of Al, similar defects are generated. Moreover, since an Al film and a Ta film are laminated, the total film thickness increases. Consequently, the coverage of the signal wiring lines crossing these films is degraded, or the stop coverage of the signal wiring lines degrade at crossing the points, resulting in wire breakage. This undesirable event can hardly be avoided, and the yield lowers. As described above, in the structure of the example, by using the Mo—W alloy, an XGA-level wiring resistance can be obtained by a single layer.

It was formed that an MoW film on Al film was inferior in quality to an MoW single layer film. Next, the difference between the signal layer or the SiOx MoW film structure and the MoW/Al film structure will now be described. With respect to samples of both film structures, resistance values, sizes of crystal grain structures and interface reaction products were examined. It was found that the resistance of the MoW film in the MoW/Al structure is greater than that of the Mow film in the MoW/SiOx structure by 4 to 10%. In addition, it was found, by observation by means of an FE-SEM, that the Mo—W grain size of the MoW/SiOx film structure is greater. The reason for this appears to be that the resistance value of the film of the Mo—W alloy, which is influenced by the Mo—W grain size, is greatly influenced by the grain size of the material of the underlying layer. This means that the MOW film formed on the Al film had poor crystallinity. With respect to the MoW/Al film structure, when a MOW film was peeled off by immersion in $H_2O_2$, a component such as (MOx, $Al_2(MO_4)_3$, M: Mo, W) was observed. It was found that MOW and Al reacted at the interface. Since an MoW—Al alloy has a high resistivity, an MOW film is more effective than a film formed of an MOW layer and an Al layer. As described above, it is understood that the liquid crystal display device having the structure of the present invention, which comprises an MOW film, has excellent advantages.

EMBODIMENT 2

FIG. 13 is a sectional view showing a TFT (switching element) and a capacitor portion which are used for one example of a liquid crystal display device according to an embodiment 2 of the present invention. The arrangement and manufacturing process of the TFT and the capacitor portion will be described below. An insulating film 57 such as silicon dioxide is formed on a glass substrate 11 by PECVD, CVD, sputtering or the like. An Mo—W alloy is sputtered to a thickness of 300 nm to simultaneously form a gate electrode (control electrode) 52, an address wiring line, and a Cs line 59. Thereafter, a 350-nm thick oxide film 53, a 300-nm thick active layer consisting of a-Si, and 50-nm thick $n^+$ a-Si layers 55a and 55b are continuously formed on the resultant structure by plasma CVD. An island-shaped a-Si active layer 54 is formed by patterning the resultant structure. A pixel electrode 58 is then formed by sputtering ITO to a thickness of 120 nm. $SiO_x$ of a contact portion is etched by using diluted HF to form a contact hole. A source electrode (first main electrode) 56a, a drain electrode (second main electrode) 56b, and a data wiring line are simultaneously formed by sputtering a predetermined metal such as Al and performing wet etching.

An address wiring line formed by using an Mo—W alloy is processed by CDE (Chemical Dry Etching) using a gas mixture of $CF_4$ and $O_2$. Tapering of the address wiring line is facilitated by interposing a silicon dioxide film between the glass substrate 51 and the address wiring line. However, if an Mo—W film directly on glass substrate, taper etching of Mo—W was difficult especially for the case of larger microwave power of CDE. FIG. 14 shows a cross-section of a tapered portion. As is apparent from FIG. 14, the step coverage of an insulating interlayer formed on the address wiring line is improved, and a high breakdown voltage can be ensured, thereby preventing a short circuit between each address wiring line and each data wiring line and also preventing disconnection of each data wiring line. Therefore, a reliable liquid crystal display device having a large display area can be realized. Note that even if this address wiring line is not applied to a large-area display, there is still a merit. That is, as the resistivity of an address wiring line decreases, the width of the wiring line can be reduced to increase the aperture ratio.

Table 1 shows comparison between XPS analysis results respectively obtained in a case wherein a silicon dioxide film is interposed between a glass substrate and an Mo—W alloy film after CDE etching and in a case wherein an Mo—W alloy film is directly formed on a glass substrate after CDE etching.

As is apparent from Table 1, when an Mo—W alloy is directly formed on a glass substrate, Ba is present in a glass component. From this result, it can be considered that the etching of resist is impaired by a product of reaction between a component in a glass used as a substrate and W or Mo, and that taper etching is subsequently restricted. By interposing a silicon dioxide film between a glass substrate and a metal, a good tapered portion can be formed without causing this reaction. It is confirmed that a good tapered portion can be formed when the W composition ratio of an Mo—W alloy composition falls within the range of 20 to 90 atm %.

Of the elements in a glass substrate, Ba is not only the element that causes such a reaction. For example, Ca and Sr have similar adverse effects. In addition to silicon dioxide film, other materials such as silicon nitride film can be used as a material for an insulating film interposed between the glass substrate and the Mo—W alloy film as long as they contain no Ba, Sr, and Ca. $Ta_2O_5$, $Al_2O_3$ film, and the like can also be used.

TABLE 1

|  | C | N | O | F | Ba | Si | Mo | W |
|---|---|---|---|---|---|---|---|---|
| ON A GLASS SUBSTRATE | 29.3 | 9.2 | 20.9 | 29.6 | 5.4 | — | 2.0 | 3.7 |
| ON A $SiO_2$ FILM | 19.0 | — | 50.4 | 2.0 | — | 28.6 | — | — |

The above manufacturing process is only an example, and the thickness of each layer, the film formation methods, and the like can be modified as needed. Even in such a case, the same effects as those of the example 3 can be obtained. In addition, a TFT having a structure different from that of the above-described TFT may be used. For example, a TFT having an insulating film as a stopper formed on a channel may be used. Furthermore, a TFT having a capacitor portion which is constituted by the same wiring layer as that of a gate electrode and the same wiring layer as that of a data wiring line may be used.

Embodiment 2 of the present invention is not limited to above example.

In addition, the semiconductor material used in the present invention is not limited to a-Si, and p-Si and CdSe may be used. Various changes and modifications can be made without departing from the spirit and scope of the invention.

Since ITO is used for a TFT liquid crystal display device, several problems are posed in contacts between wiring lines and ITO. When a wiring line is brought into contact with ITO, the wiring metal is oxidized by ITO to form a barrier oxide having a high resistance, resulting in a contact failure. This poses a serious problem especially in a case wherein an Al alloy or Ta alloy which produces an oxide film having a high resistance is used. For this reason, a barrier metal is required to prevent a reaction between ITO and an Al alloy or Ta alloy, increasing the number of steps. In addition, when an oxide film is formed on the surface of a wiring line, the contact resistance between the wiring line and a metal wiring line as an upper layer increases. For this reason, the step of removing the oxide film is required, increasing the number of steps.

Another problem is that when reactions occur in contact portions between signal wiring lines and a-Si active layer and p-Si layer, the wiring metals are dispersed in the a-Si and p-Si layers to degrade the junction characteristics of n-i or p-i in the contact portions, resulting in a degradation in blocking effect with respect to carriers. This degradation is conspicuous when Al is used as a source/drain metal which is an acceptor impurity. In order to prevent this, a barrier metal is required, resulting in an increase in the number of steps.

This embodiment provides a liquid crystal display device which exhibits the same effects of as the above embodiments, by virtue of the use of MoW, which requires no barrier metals between a signal wiring line metal and ITO and between a signal wiring line metal and $n^+$ a-Si, and which has signal wiring lines resistant to etching solutions for ITO and the like.

(Example 5)

FIG. 15 is a sectional view showing a TFT (switching element) and a capacitor portion which are used for one example of a liquid crystal display device according to an embodiment 3 of the present invention. FIG. 15 also shows a driving circuit and a section of a contact portion. The arrangement and manufacturing process of the TFT and the capacitor portion will be described below. A gate electrode (control electrode) 62, an address wiring line, a Cs line 69, and contact pad portion 80 are simultaneously formed on a glass substrate 61 by sputtering an Mo—W alloy to a thickness of 300 nm and performing CDE. Thereafter, a 350-nm thick oxide film 63 is formed by plasma CVD or atmospheric pressure CVD, and a 50-nm thick $SiN_x$ film 63 a 50-nm thick active layer consisting of a-Si, and a 300-nm thick stopper SiNx film 70 are successively formed by plasma CVD. After the stopper $SiN_x$ film 70 is etched by using diluted HF, 50-nm thick $n^+$ a-Si layers 65a and 65b are formed, and an island-shaped a-Si active layer 64 is formed by CDE. An $SiO_x$ film of the contact portion is etched to form a contact hole. Subsequently, an ITO 66 and an Mo—W or Mo—Cr alloy 67 are sputtered to thicknesses of 100 nm and 300 nm, respectively, and the Mo—W alloy is etched and tapered by wet etching or dry etching using a gas mixture of $CF_4$ and $O_2$. Thereafter, the ITO is etched by using a diluted aqua regia etchant, thereby forming a pixel electrode 68, a signal wiring line, a source electrode (first main electrode) 66a, 67b, a drain electrode (second main electrode) 66b, 67b, a data wiring line, and a contact electrode 81. An $SiN_x$ passivation film 71 is formed on the resultant structure by plasma CVD. The $SiN_x$ and the Mo—W alloy on the pixel and pad portions are etched by RIE or CDE. By forming the signal wiring line and the pixel electrode 68 using the same pattern in this manner, the number of photoetching processes can be decreased by one. In addition, the embodiment 3 of the present invention can be formed by using an Mo—Cr alloy in the same manner as described above.

In the Embodiment 3, an Mo—W/ITO multilayered wiring line is used as a signal wiring line, a gate wiring line is brought into contact with ITO in a contact pad portion. When the Mo—W or Mo—Cr alloy is used, since an oxide film formed on the alloy surface has a low resistance in contrast to a Ta alloy, At, or Cr, an increase in contact resistance poses no problem. Although an oxide film was formed on a gate wiring line, since an oxide film formed on an Mo—W or Mo—Cr alloy had a low resistance, good contact characteristics were obtained without removing the oxide film. The increase in wiring resistance including the contact resistance was 1% or less, posing no problems. In addition, the Id-vd characteristic of the TFT characteristics exhibited good rise characteristics, thus obtaining good Ohmic characteristics. Hence, it was found that a good contact was ensured between each Mo—W wiring line and $n^+$ a-Si. By using batch type sputter adhesion of $H_2O$, $O_2$, $N_2$ on the chamber surface and incorporation of O, N in the sputtered MoW film is inevitable.

The present inventors checked the resistivities of Mo—W alloys. FIG. 16 shows the result. These alloys were formed by using a batch type sputtering apparatus. A load lock type sputtering apparatus with a low back pressure has negligible such $O_2$ or $N_2$ impurity. As is apparent from FIG. 16, in the case of the batch type sputtering apparatus, it was found that the resistivity of an Mo—W alloy became much lower than 40 $\mu\Omega$·cm, and the resistance of the alloy was below that of Mo or W as a signal element when the W content of the Mo—W alloy fell in the range of 10 to 95 atm %, and more preferably in the range of 20 to 90 atm %. In this range, even an Mo—W alloy produced by the batch type sputtering apparatus has a resistivity similar to that of an Mo—W alloy produced by the load lock type sputtering apparatus. That is, in this range, an inexpensive batch type sputtering apparatus can be used, and Mo—W alloys can be manufactured in a short tact time because sputtering can be performed at a low degree of vacuum.

According to example 5, since pixel and signal wiring lines are formed by using the same mask, no alignment margin is required. Hence, the opening ratio can be increased.

The above manufacturing process is only an example, and the thickness of each layer, the film formation methods, and the like can be modified as needed. Even in such a case, the same effects as those of the Embodiment 3 can be obtained. In addition, a TFT having a structure different from that of the above-described TFT may be used. For example, a back channel type TFT or the like may be used, which is formed by etching an $n^+$ a-Si layer by using a signal line as a mask without forming an insulating film as a stopper on a channel. Furthermore, a TFT having a capacitor portion which is constituted by the same wiring layer as that of a gate electrode and the same wiring layer as that of a data wiring line may be used.

(Example 6)

In the Embodiment 3, the same effects as those described above can be obtained by using a structure having an a-Si active layer formed on a signal wiring line. Similar to example 5, after a gate electrode is formed by using an Mo—W alloy, a 350-nm thick $SiO_x$ film and a 50-nm thick $SiN_x$ film are formed by plasma CVD, and a contact hole is formed by using diluted HF. An ITO layer and an Mo—W alloy are formed by sputtering. Subsequently, a 50-nm thick $n^+$ a-Si layer is formed by plasma CVD. The $n^+$ a-Si layer and the ITO layer are etched by CDE, and the ITO layer is etched by a diluted aqua regia, thereby forming a signal wiring line, a source electrode (a first main electrode), a drain electrode (a second main electrode), and a pixel electrode. The Mo—W alloy film may be formed by thermal CVD. The $n^+$ a-Si layer may be selectively formed on the Mo—W/ITO layer by using an intermittent plasma constituted by $SiH_4/PH_3$ mixture and $H_2$ gas. After an a-Si layer and a passivation $SiN_x$ film are formed on the resultant structure by plasma CVD, the a-Si/$n^+$ a-Si/Mo—W of the pixel portion are etched by RIE, thus completing a TFT array. In this case, in the contact portion, a gate wiring line was brought into contact with the ITO, and a signal wiring metal was brought into contact with the ITO. However, no problem was posed in terms of Ohmic characteristics.

(Example 7)

FIG. 17 is a sectional view showing a TFT and a capacitor portion which are used for other example of a liquid crystal display device according to Embodiment 3 of the present invention. The arrangement and manufacturing process of this TFT and capacitor portion will be described below. A 100-nm thick p-Si layer 84 and a 100-nm thick gate oxide film 83 are formed on a glass substrate 81. A gate electrode 82 consisting of an Mo—Ta alloy or an Mo—W alloy is formed on the resultant structure. Subsequently, P ions are doped into $1 \times 10^{16}$ $cm^{-3}$ by using the gate electrode 82 as a mask to form an $n^+$ p-Si layer 85a, 85b in a source/drain portion. After an island-shaped a-Si active layer is formed, an insulating interlayer 89 is deposited on the resultant structure to a thickness of 300 nm by thermal CVD. ITO is sputtered to a thickness of 100 nm to form a pixel electrode 88. Insulating interlayer 89 of the contact portion and the gate portion are etched by using diluted HF to form a contact hole. Thereafter, an Mo—W alloy is sputtered to a thickness of 300 nm to form a source electrode (a first main electrode), a drain electrode (a second main electrode) 86b, and a signal wiring line. After a passivation film 87 consisting of $SiN_x$ is formed by plasma CVD, a pixel portion and a peripheral circuit connecting portion are etched by RIE, thereby completing a TFT array. In a conventional device, since an Al is used as a metal of a signal wiring line, a metal having a high melting point as a barrier metal is required between an ITO layer and an $n^+$ p-Si layer. In this embodiment, however, since a signal wiring line was made of an Mo—W alloy, no barrier metal was required, thus decreasing the number of steps. The same effects as those described above were obtained when an Mo—Cr alloy was used.

The above manufacturing process is only an example, and the thickness of each layer, the film formation methods, and the like can be modified as needed. Even in such a case, the same effects as those of the embodiment can be obtained. In addition, a TFT having a structure different from that of the above TFT may be used. For example, a TFT having an insulating film as a stopper formed on a channel may be used. Furthermore, a TFT having a capacitor portion which is constituted by the same wiring layer as that of a gate electrode and the same wiring layer as that of a data wiring line may be used.

Embodiment 3 is not limited to the embodiments described above. The semiconductor used in the present invention is not limited to a-Si, and p-Si and CdSe may be used. In addition, the insulating film on the data wiring line is not limited to an oxide film, and a nitride film may be used.

Furthermore, the alloy film used in Embodiment 3 described above is not limited to a single-layered structure. Instead of using such a film, a multilayered film constituted by two or more layers made of alloys having difference compositions may be used. In addition, a metal layer consisting of Ta, TaN, or the like may be formed on the surface of the above alloy film, i.e., formed as an upper layer, to improve the acid resistance. Moreover, an Al film, a Cu film, or the like may be stacked as a lower layer of the above alloy film to decrease the resistance. Embodiment 3 is not limited to the above-described examples. Various changes and modifications can be made without departing from the spirit and scope of the invention.

According to Embodiment 3, since an address or gate wiring line formed by using an Mo—W or Mo—Cr alloy having a low resistivity does not produce a barrier having a high resistance even if it is oxidized upon contact with an ITO layer, no barrier metal is required, thus simplifying the manufacturing process. In addition, since such a wiring line does not react with $n^+$ a-Si or p-Si, no barrier metal is required. Hence, the manufacturing process can be simplified.

EMBODIMENT 4

In a liquid crystal display device, a black matrix is formed on an opposed substrate for image display. The black matrix shields external light incident on an TFT and prevents leakage current increases of the TFT due to the external light. In general, Cr, etc., which are impermeable to light are used as materials of the black matrix. These materials, however, have rather high light reflectance, and external light is reflected by the image display surface. The external light degrades the display quality of the image display screen considerably. The present embodiment aims at providing a high-quality liquid crystal display device wherein gate pulses are free from delay, the address wiring has a high insulation breakdown voltage, and reflection of external light on the image display screen is reduced by the black matrix.

FIG. 18 shows a sectional view of a liquid crystal display device according to Embodiment 4 of the present invention. Reference numeral 90 denotes a glass substrate. A gate electrode 91a is formed on the glass substrate 90, and the gate electrode 91a extends from address wiring line formed on the substrate 90. A semiconductor layer 94 and a stopper layer 95 are formed and patterned on the gate electrode 91a through an insulating film 97. A drain electrode 93a and a source electrode 93b are formed on the resultant structure. Thus, a TFT is constructed. The source electrode 93b of the TFT is connected to a pixel electrode 96. Thus, a liquid crystal driving circuit board is constituted.

An opposed substrate is formed such that a color filter 99 and a black matrix 100 made of a Mo—W alloy are formed on a glass substrate 98 and an opposed electrode 101 is formed on the resultant structure. The liquid crystal driving circuit and the opposed substrate are arranged to face each other, as shown in FIG. 18, and a liquid crystal material 102 is put between the liquid crystal driving circuit and the opposed substrate. Thus, the liquid crystal display device is constructed.

FIG. 19 is a graph showing a measured result of reflectance of an Mo—W alloy and Cr. As seen from FIG. 19, the reflectance of the Mo—W alloy is lower than that of Cr used as conventional black matrix material throughout all compositions.

In the above liquid crystal display device, since the black matrix formed on the opposed substrate is made of the Mo—W alloy with low reflectance, reflection of external light by the image display surface can be reduced and thereby the display quality can be enhanced. The Mo—W alloy material has substantially the same effect for shielding light incident on the TFT as Cr.

FIG. 20 is a plan view of the driving circuit board of the liquid crystal display device according to Embodiment 4 of the invention. Address wiring lines 91 and data wiring lines 92 crossing the address wiring lines 91 are formed on the glass substrate 90. The address wiring lines 91 have at one end address electrode pads 103 made of the Mo—W alloy. The data wiring lines 92 have at the other end data electrode pads 106 made of the Mo—W alloy. Insulating layers are formed between the address wiring lines 91 and data wiring lines 92 at the intersections thereof. TFTs 107 functioning as switching elements are formed near the intersections. A pixel electrode 96 formed on a pixel region surrounded by the address wiring lines 91 and data wiring lines 92 is connected to one electrode of each of the TFTs 107. The region of the address electrode pad 103 is large enough to include an address electrode 105 and a contact hole 104.

In the liquid crystal display device having the above structure, since the address electrode pads 103 and data electrode pads 106 are formed of the Mo—W alloy, the bonding force acting between these electrode pads and image signal ICs increases and high reliability, and good ohmic contact is obtained, for example, at the time of COG (Chip On Glass) mounting.

Needless to say, the effect achieved by the black matrix 100 formed on the opposed substrate can be obtained by black matrix 108 formed on the liquid crystal driving circuit substrate. In addition, since the reflectance of the Mo—W alloy is low, the Mo—W alloy may be used as material of data wiring line.

As has been described above, according to the liquid crystal display device of the present embodiment, the Mo—W alloy is used as black matrix material and thereby the reflection of external light by the image display screen can be reduced and a high display quality can be obtained. Moreover, the reliability of bonding between the ICs and the address and data electrode pads, for example, at the time of COG mounting, can be increased by forming these pads of the Mo—W alloy.

EMBODIMENT 5

According to Embodiment 5, there is provided an electrode wiring material containing at least one component selected from the group of Mo and W as a main component, and further containing Ar of 0.0003 atomic % to 5 atomic %. Further, there is provided an electrode wiring material containing W as a main component, or at least one selected from the group of W, Mo and Cr as a main component, and further containing Ar of 0.0003 atomic % to 5 atomic %.

Furthermore, according to Embodiment 5, there is provided an electrode wiring board manufactured by forming an electrode wiring portion on a glass substrate, in which the electrode wiring portion is made of at least one metal selected from Mo and W, and the variation of the lattice constant of a material in the electrode wiring portion, with respect to the lattice constant of the material in a bulk state, is set within ±3%. Further, there is provided an electrode wiring board manufactured by forming an electrode wiring portion on a glass substrate, in which the electrode wiring portion is made of W or at least one metal selected from W, Mo and Cr, and the variation of the lattice constant of a material in the electrode wiring portion, with respect to the lattice constant of the material in a bulk state, is set within ±3%. It should be noted that the significance of that the lattice constants are substantially equal to each other, is the variation of the lattice constant of a material, with respect to the lattice constant of the material in a bulk state is within ±3%, preferably ±1%.

First, in the electrode wiring material, the content of Ar with respect to the main component metal is set to 0.0003 atomic % to 5 atomic %. If the content of Ar is less than the lower limit, it is industrially very difficult to form a film, whereas if the content exceeds the upper limit, the resistivity of a film obtained is significantly raised. More preferably, the content of Ar is 0.001 atomic % to 1 atomic %. Most preferably, the content of Ar is 0.2 atomic % to 1 atomic % by considering the peel off rate and the apparatus dependence.

With regard to the electrode wiring board, it is preferable that the electrode wiring portion is formed by a spattering method. Thus, a film having a high adhesion can be formed on a substrate having a large area.

In Embodiment 5, it is preferable that Ti is added to the main component. With this constitution, the adhesion and the resistance to acid are improved at the same time. In embodiment 5, if the main component metal is at least one type selected from Mo and W, the content of W or Mo is in a range of 10 atomic % and 95 atomic %. This results because if the content of W or Mo is in a range of 10 atomic % and 95 atomic %, the margin of the sputtering conditions for achieving a film having a low resistivity is widened.

An example of the electrode wiring board is a substrate on which a liquid crystal display device or a semiconductor device is formed. The electrode wiring material is not made of, for example, W, Mo or the like, which is the conventional electrode wiring material, but also contains Ar at a predetermined content in the material. With this structure, the resistivity can be sufficiently reduced, or an excellent corrosion-resistance property as compared to that of Ar, or the like, can be maintained.

With use of such an electrode wiring material, the electrode wiring portion can be formed by making a film by sputtering in a gas atmosphere of, for example, Ar. In this case, it is necessary to adjust the conditions for making films, such as the power and the pressure of the sputtering device.

In the case where an electrode wiring portion is formed by use of the above-described electrode wiring material, Mo and W may be mainly used as a single phase, or the film may be formed along with an alloy of these metals or a metal having a high melting point, such as Cr. By making an alloy as above, the resistance of the electrode wiring portion can be reduced.

Next, Embodiment 5 will now be described in detail on the basis of the results of experiments conducted by the inventors.

First, the relationship between the amount of Ar in the electrode film formed by use of the electrode wiring material according to the present invention will now be described.

With use of a single-sheet load-lock type sputtering apparatus, the temperature of a substrate before the formation of a film was set to 200° C., the film-forming power was set to 10 kW, and the distance between electrodes was set to 5 cm. Then, in an atmosphere of Ar gas of a pressure of 0.9 Pa, MoW containing 65 atomic % of Mo was deposited on a glass substrate, thus forming an MoW alloy film having a thickness of 300 nm (Sample 1). The Ar content in the film of Sample 1 was measured using a fluorescent X-ray apparatus, RIX-1000 (product of RIGAKU DENKI KOGYO), to be 0.3 atomic %. Further, the resistivity of Sample 1 was measured to be 17 $\mu\Omega$·cm.

With use of a sputtering apparatus of a type having a great number of diagonal injection components, the temperature of a substrate before the formation of a film was set to 300° C., the film-forming power was set to 1 kW, and the distance between electrodes was set to 10 cm. Then, in an atmosphere of Ar gas of a pressure of 0.5 Pa, MoW containing 65 atomic % of Mo was deposited on a glass substrate, thus forming an MoW alloy film having a thickness of 300 nm (Sample 2). The Ar content in the film of Sample 2 was measured to be about 20 atomic %. Further, the resistivity of Sample 2 was measured to be 50 $\mu\Omega$·cm.

With use of a single-sheet load-lock type sputtering apparatus, the temperature of a substrate before the formation of a film was set to 200° C., the film-forming power was set to 10 kW, and the distance between electrodes was set to 5 cm. Then, in an atmosphere of Ar gas of a pressure of 0.9 Pa, MoW containing 30 atomic % of Mo was deposited on a glass substrate, thus forming an MoW alloy film having a thickness of 300 nm (Sample 3). The Ar content in the film of Sample 3 was measured to be 3 atomic %. Further, the resistivity of Sample 3 was measured to be 25 $\mu\Omega$19 cm.

It has been confirmed from the results of the intensive studies of the inventors that the resistivity is drastically increased when the Ar content in the film exceeds 5 atomic %. Further, when the Mo or W content of the film falls outside a range of 10 atomic % to 95 atomic %, the resistivity is increased in a similar manner as above.

As described above, in the case where the resistivity is taken into consideration, it has been confirmed that the amount of addition of Ar to the material should preferably be 5 atomic % or less. However, when the amount of addition of Ar is less than 0.0003 atomic %, the film-forming power used at the formation of a film should be reduced, and the sputtering rate should be decreased to a sufficient level. Further, after the formation of the film, the film constituting materials must be recrystallized. Therefore, in the case where the amount of addition of Ar is less than 0.0003 atomic %, such a structure is not at all industrially suitable.

Furthermore, the inventors of the present invention have used a single-sheet load-lock type sputtering apparatus, forming MoW alloy films having a thickness of 300 nm by depositing MoW containing 65 atomic % of Mo, on a glass substrate, in variable film-formation conditions, thus obtaining MoW alloys having different Ar contents in the films. Thus, the MoW alloy film containing a large amount of Ar can be obtained by increasing the film-forming power, or by decreasing the film-forming pressure.

FIG. 21 is a characteristical diagram illustrating the relationship between each of the stress, the resistivity and the film peel off rate, and the Ar content in the film. It can be understood from FIG. 21 that the stress and the resistivity exhibit excellent characteristics when the Ar content is in a range of 0.0003 atomic % to 5 atomic %. Meanwhile, as can be seen in FIG. 21, the film peel off rate exhibits an increasing tendency in a region where the Ar content is less than 0.4 atomic %. Consequently, in a usage where the adhesion of film is particularly important, the Ar content is preferably set in a range of 0.4 atomic % to 5 atomic %.

In consideration of the above-described circumstances, the Ar content of the electrode wiring material of the present invention is set in a range of 0.0003 atomic % to 5 atomic %. The elements to be added may be mixed into the metal of the main component of the electrode wiring material singly or in combination.

In the case where the elements are mixed into the material in combination, the characteristics of the film are substantially an addition of changes in characteristics affected by the addition of the individual elements.

Next, the film-forming gas dependency and the constitution dependency of the resistivity will now be described with reference to FIG. 22. FIG. 22 is a characteristical diagram illustrating the relationship between the resistivity and the Mo content. The samples were obtained under the following conditions. That is, with use of a small-size single-sheet load-lock type sputtering apparatus, the temperature of a substrate before the formation of a film was set to 150° C., the film formation power was set to 2 kW, and the distance between electrodes was set to 5.5 cm. Then, in an atmosphere of Ar gas of a pressure of 0.9 Pa, films having a thickness of 300 nm were deposited on glass substrates. The Ar contents of the sample films were within a range set by the present invention.

As can be seen from FIG. 22, the larger the content of Mo, the more the resistivity can be lowered. In the case of the formation of a film in an Ar atmosphere, the resistivity can be decreased more when the film is made of a single phase of Mo.

FIG. 23 is a characteristical diagram showing the relationship between the lattice constant measured by X-rays and the Mo content. As can be seen in FIG. 23, by forming a film in an Ar atmosphere, the lattice constant becomes closer to that of the bulk state, achieving a high crystalizability. Thus, the resistivity can be reduced. In practice, those films exhibited low resistivities when the ratio to the lattice constant of the bulk state is within 1.03 times, preferably 1.01 times.

Next, the dependency of the characteristics of the film upon the film-forming conditions will now be described with reference to FIGS. 24 to 27. FIG. 24 is a characteristical diagram illustrating the relationship between the resistivity and the film-forming power, and more specifically the dependency of the resistivity on the film-forming power in an atmosphere of a gas pressure of 0.9 Pa. FIG. 25 is a characteristical diagram illustrating the relationship between the resistivity and the gas pressure, and more specifically the dependency of the resistivity on the gas pressure when the film-forming power is 10 kW. The samples of FIGS. 24 and 25 were obtained under the following conditions. That is, with use of the above-mentioned single-sheet load-lock type sputtering apparatus, the temperature of a substrate before the formation of a film was set to 200° C., and the distance between electrodes was set to 5 cm. Then, in an atmosphere of Ar gas, MoW alloy films containing 65 atomic % of Mo were deposited to have a thickness of 400 nm on glass substrates.

FIG. 26 is a characteristical diagram illustrating the relationship between the resistivity and the film-forming power, and more specifically the dependency of the resistivity on the film-forming power in an atmosphere of a gas pressure of 0.75 Pa. FIG. 27 is a characteristical diagram illustrating the relationship between the resistivity and the gas pressure, and more specifically the dependency of the resistivity on the gas pressure when the film-forming power is 2 kW.

The samples of FIGS. 26 and 27 were obtained under the following conditions. That is, with use of a small-size single-sheet load-lock type sputtering apparatus which is different from the type mentioned before, the temperature of a substrate before the formation of a film was set to 150° C., and the distance between electrodes was set to 5.5 cm. Then, in an atmosphere of Ar gas, MoW alloy films containing 65 atomic % of Mo were deposited to have a thickness of 300 nm on glass substrates. As can be understood from the results of the experiment carried out in the above-described conditions, with regard to the formation of a film in an Ar atmosphere, the resistivity can be lowered by decreasing the film-forming power to a relatively low level and setting the gas pressure at a high level.

Further, it has been understood from the examination of the relationship between the thickness of a film and the resistivity that the resistivity is somewhat high when the thickness of the film is 30 nm or less, but the quality of film is stabilized when the thickness of the film exceeds 30 nm, and a constant resistivity is exhibited.

(Example 8)

Figure 28:
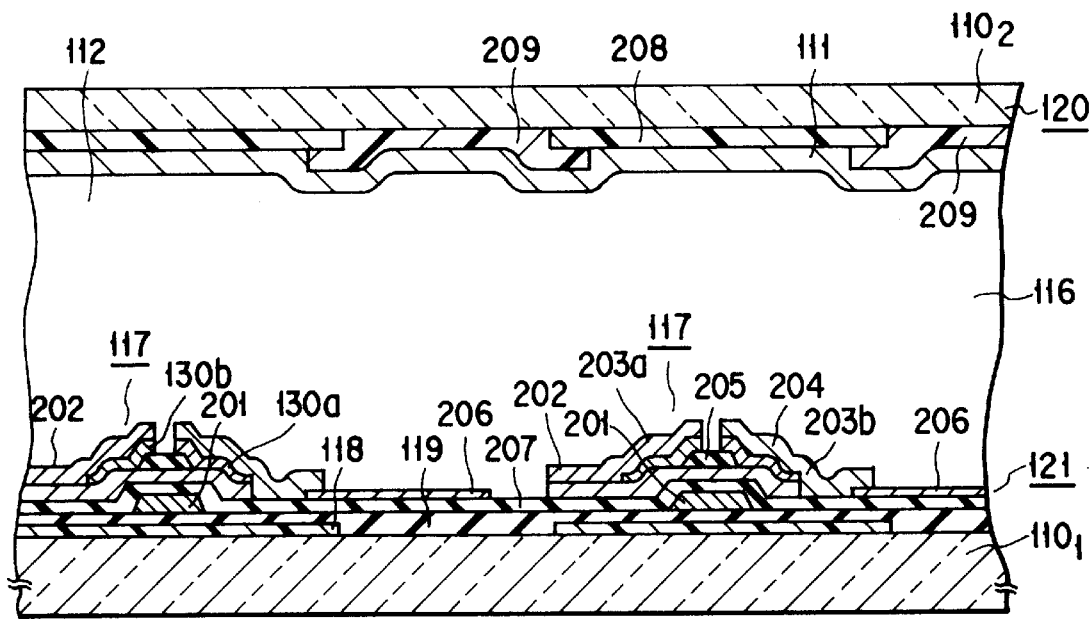
FIG. 28 is cross sectional view taken along the line A—A in FIG. 29.
Figure 29:
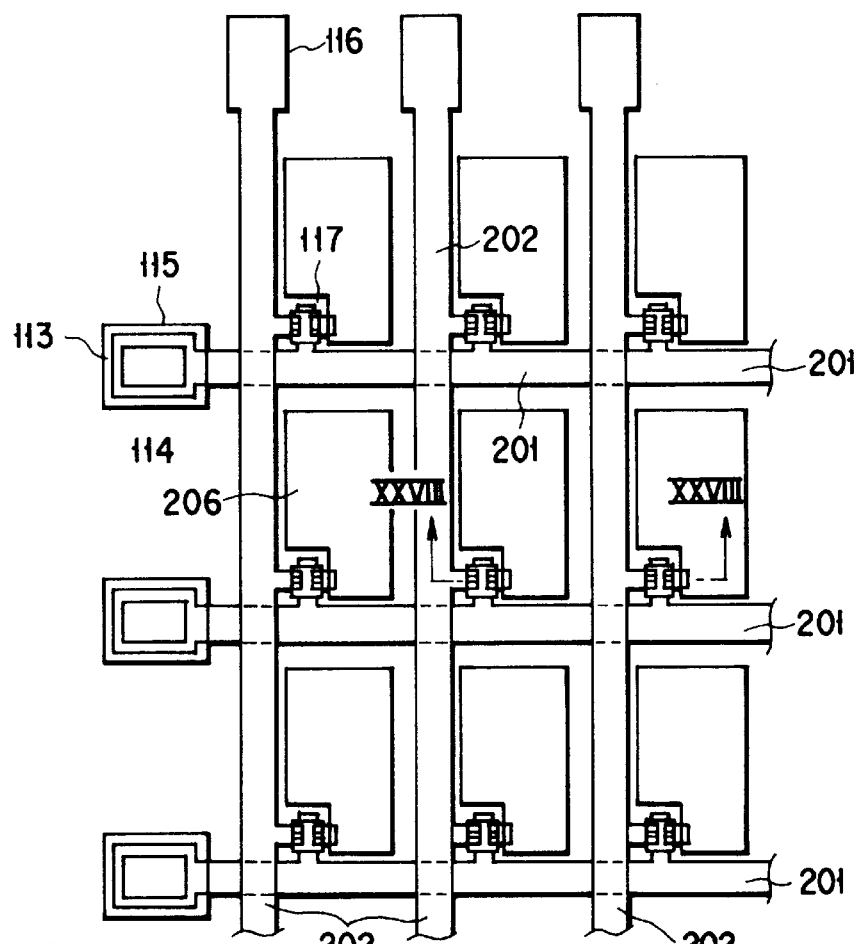
FIG. 29 is a plan view showing a driving circuit board of a liquid crystal display device employing an electrode wiring material of the present invention.

FIG. 29 is a plan view showing a driving circuit board (electrode wiring substrate) of a liquid crystal display device employing the electrode wiring material of the present invention. FIG. 28 is a cross sectional view taken along the line XXVIII—XXVIII of FIG. 29. FIG. 29 shows only pads which serve as electrode wiring portions and electrodes. In this example, the structures of TFT used and the section of the accumulation capacity, and the process thereof, will be mainly discussed.

FIG. 28 illustrates glass substrates $110_1$ and $110_2$. A lower side black matrix 118 is formed on the glass substrate $110_1$, and an insulating film 119 is formed on the black matrix 118. A gate electrode 201 made of an Mo—W alloy and extended from an address wiring portion (integrated with the gate electrode) is formed on the insulation film 119. A semiconductor layer 204 and a stopper insulating film 205 are formed via an insulating film 207 on the gate electrode 201, and they are patterned.

The gate electrode 201 is formed in the following manner. First, a glass substrate $110_1$ is placed in a single-sheet load-lock type sputtering apparatus, and the temperature of a substrate before the formation of a film is set to 150° C., the film-forming power is set to 7 kW, and the distance between electrodes is set to 5 cm. Then, in an atmosphere of Ar gas of a pressure of 0.9 Pa, sputtering is carried out with use of an MoW alloy target, and MoW containing 65 atomic % of Mo was deposited on the glass substrate $110_1$, thus forming an MoW alloy film having a thickness of 300 nm. The Ar content in the film was 0.3 atomic %, the lattice constant was 3.15 angstrom, which is substantially equal to that of the bulk state. Further, the resistivity of the MoW alloy film could be reduced to a sufficiently low level, that is, 15 ~Ω·cm.

Next, the MoW alloy film was etched into a tapered shape using a mixture gas of $CF_4$ and $O_2$, thus forming a gate electrode 201 having a taper angle of 35°. The taper angle of the gate electrode should preferably be in a range of 20° to 60°, and more preferably, 25° to 50°, in order to improve the coverage by the gate insulation film.

Next, an insulating film 207 made of a lamination body of $SiO_2$ and SiNx, a semiconductor layer 204 made of a-Si:H or the like, and a stopper insulating film 205 made of SiNx, are formed on the gate electrode, and these films are patterned. Further, a drain electrode 203a and a source electrode 203b, made of Al/Mo (stacked film) or an Mo—W alloy, are formed on the above-described structure.

FIG. 25 illustrates source and drain regions 130a and 130b made of n-type amorphous silicon. A TFT 117 is formed as described above, and a pixel electrode 206 is connected to the source electrode 203 of the TFT 117. A liquid crystal driving circuit board 121 is thus constituted. Examples of the material of the pixel electrode 206 are transparent conductive materials such as ITO and $SnO_2$.

An opposing electrode 120 has a structure in which a black matrix 209 made of a color filter 208 and an Mo—W alloy is formed on a glass substrate $110_2$, and an opposing electrode 111 made of ITO is further formed thereon. The liquid crystal driving circuit board material 116 and the opposing substrate 120 are arranged to face to each other as can be seen in FIG. 28, and a liquid crystal material 116 is interposed therebetween, thus constituting a liquid crystal display device.

On the glass substrate $110_1$, a plurality of address wiring portions 201 each having an address electrode pad 113 made of an Mo—W alloy at one end, and a plurality of data wiring portions 202, which cross with these address wiring portions 201, each having a data electrode pad 116 made of an Mo—W alloy at one end, are provided. Al the cross section of an address wiring portion 201 and a data wiring portion 202, an insulating film is provided therebetween. In the vicinity of each cross section, a TFT 117 serving as a switching element is provided so as to be adjacent to the cross section, and to the source electrode 203b, which is one of the electrode thereof, a pixel electrode 206 formed within a pixel area defined by the address wiring portion 201 and the data wiring portion 202. The region of the address electrode pad 113 has an area which includes an address electrode 115 and a contact hole 114.

The liquid crystal display device having the above-described structure exhibits a variety of effects as will now be described. That is, in a liquid crystal display device which employs TFTs, the wiring resistance should be lowered as the screen becomes larger and the image becomes finer. For example, in the case of the display (VGA) of a personal computer, the wiring portions are arranged as 480×(640×3), and in the case of the display (XGA) of a high-grade personal computer, the wiring portions are arranged as 760×(1024×3). The wiring resistances of such cases should be low for preventing the delay of a gate pulse. A pulse delay is determined by a product CR of a wiring resistance R and a capacitance C of a TFT added to a wiring portion, or of an accumulation capacitor. As the screen becomes large, the wiring portions are elongated, and therefore naturally, the value of R increases, and the value of CR increases. Further, if the number of pixels increases, the value of C ($C=C_0X_n$, $C_0$: capacitance of unit pixel, n: number of pixels) increases, thus increasing the value of CR. The value of C is determined by the pixels, and therefore, for preventing the pulse delay, the value of R must be lowered.

In an ordinary design, in which the screen size is a diagonal dimension of 10 inch class or larger, of an ordinary manufacturing method, the resistivity of VGA should be 40 $\mu\Omega$·cm, that of SVGA should be 25 to 40 $\mu\Omega$·cm or less, and that of XGA should be 20 $\mu\Omega$·cm or less. Therefore, as the wiring material of the VGA, Mo—Ta or Cr, the resistivity of which is about 40 $\mu\Omega$·cm, can be usually used; however Mo—Ta or Cr cannot be used for the XGA. In Embodiment 5, a low-resistivity Mo—W containing Ar, the resistivity of which is 15 $\mu\Omega$·cm or less, is used, and therefore a fine liquid crystal display device of the VGA or XGA standard can be provided.

With regard to Embodiment 5, it has been confirmed that an address line formed by use of an Mo—W alloy can be processed into a tapered shape by CDE (chemical dry etching) using a mixture gas of $CF_4$ and $O_2$. Further, it has been confirmed that the tapering process can be performed without imparting a deterioration to a resist, by a wet etching carried out using an alkali etchant (pH 7 to 13) containing an oxidizer having an oxidation-reduction potential higher than that of Mo or W but lower than that of Ti.

Therefore, according to this embodiment, the Mo—W alloy has a low resistivity, and therefore the address wiring portions formed of this material exhibit a low resistivity. Consequently, the delay of a gate pulse due to the wiring resistance thereof does not occur, making it possible to supply a gate pulse which is not delayed to a predetermined switching element.

Further, the Mo—W alloy film can be processed into a tapered shape, and therefore the step coverage of an interlayer insulating film formed on an address wiring portion formed of this material is improved, making it possible to maintain the withstand voltage high. It should be noted that the provision of an undercoat layer of $SiO_2$ is preferable for facilitating the taper etching; however the undercoat may not be required if etching conditions are appropriately selected or the like.

Consequently, even in the case where the display area is enlarged, it becomes possible to realize a liquid crystal display device of a high reliability. Further, in the case where the display does not have a large area, the width of the wiring portion can be reduced along with a decrease in the resistivity of an address wiring portion. Thus, the aperture rate can be improved.

Further, in the liquid crystal display device having the above-described structure, each address electrode pad 13 and each data electrode pad 16 are made of the same Mo—W alloy as that of the gate electrode, and therefore, for example, during the packaging of COG (chip on glass), the joint between these electrode pads and ICs used for image pick-up signal, connected thereto, is strengthened, thereby achieving a high reliability.

The Mo—W alloy has a low reflectivity. Consequently, with use of the Mo—W alloy as the material for the black matrix, the reflection of external light on the image display surface can be reduced, making it possible to realize a high-quality display.

Figure 30:
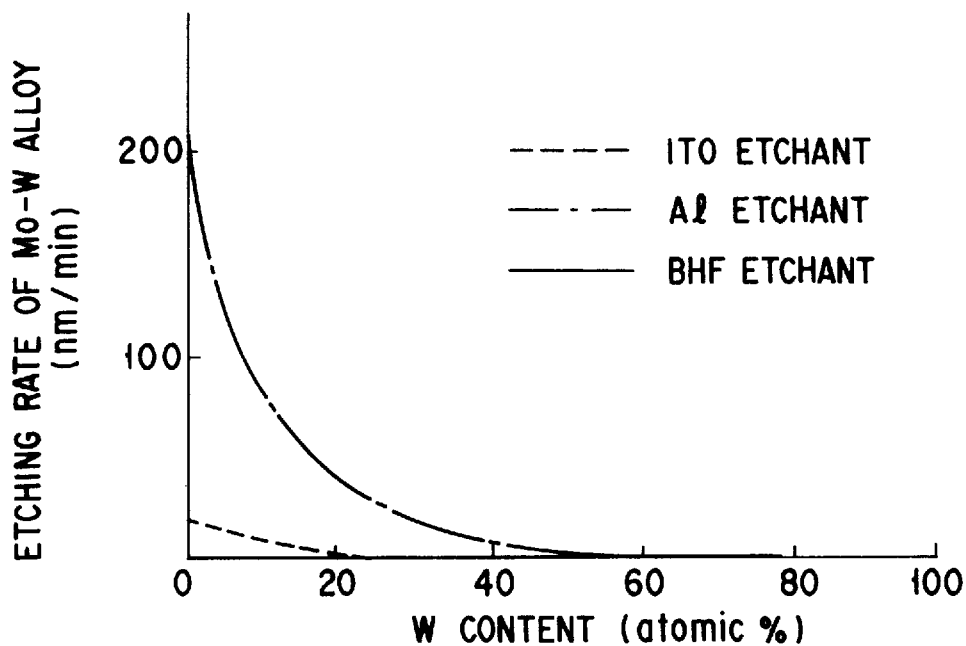
FIG. 30 is a characteristic diagram showing the relationship between the etching rate of the MoW alloy and the W content.

Further, as can be seen in FIG. 30, the chemical resistance of the Mo—W alloy is very much excellent when the W content is 20% to 95%, preferably, 25% to 90%. The etching rate of the pixel electrode material with respect to ITO etchant was 10 nm/min or less, and the material was not at all etched by BHF, which was the etchant for the interlayer insulating film. With respect to the Al etchant, the etching rate thereof was 30 to 400 nm/min or less. Especially, in the case where the W content is 50% or higher, the material was not etched by any of the etchants. Consequently, in the case where the Mo—W alloy is used as the wiring material for each member, a fine processing can be carried out, making it possible to realize a fine liquid crystal display device such as the display (VGA) (wiring arrangement: 480×(640×3)), for a personal computer or the display (XGA) (wiring arrangement: 760×(1024×3)), of a high-grade personal computer.

Figure 31:
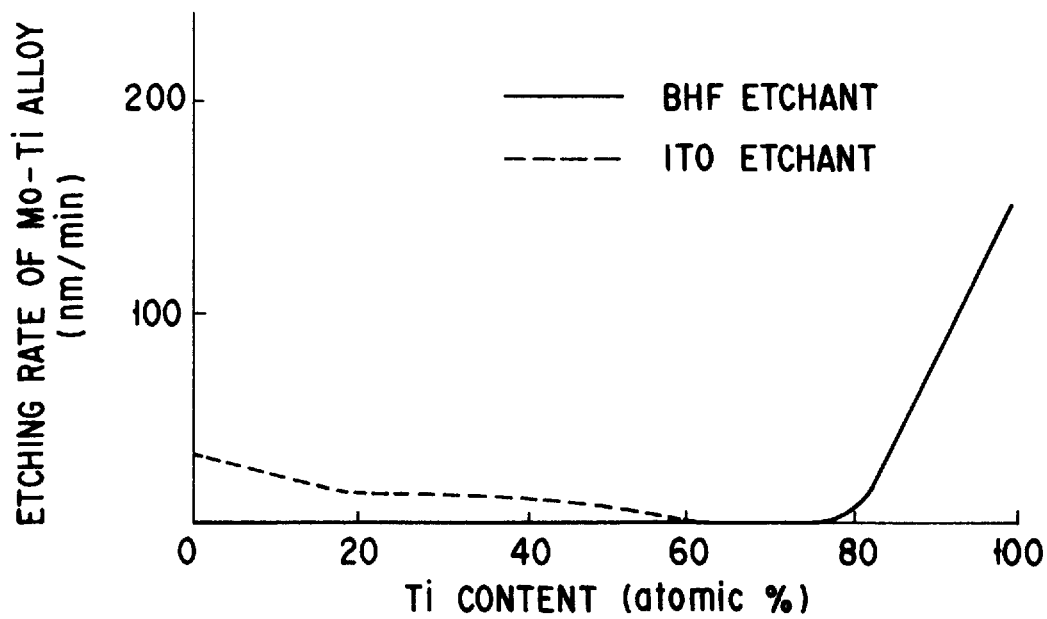
FIG. 31 is a characteristic diagram showing the relationship between the etching rate of the MoTi alloy and the W content.

According to the research of the inventors on the etching characteristics of Mo—Ti containing 0.3 atomic % of Ar, which is close to Mo—W in terms of characteristics, it has been confirmed that the chemical resistance of the Mo—W alloy with respect to the ITO etchant used for forming the pixel electrode 6 or to the BHF used for making a contact hole, are significantly excellent when the Ti content is 20 to 80%, as can be seen in FIG. 31. Further, it has been confirmed that with the use of a weak alkali etchant (pH 7 to 9) containing an oxidizer having an oxidation-reduction potential higher than that of Ti, the etching can be carried out without dissolving the resist. Also with W—Ti, an excellent acid resistance has been admitted. Further, it has been confirmed that substantially the same effects can be achieved with the addition of about 5 atomic % of Ta, Nb, Cr, Zr or Hf other than Ti.

In Embodiment 5, it has been confirmed that sufficiently excellent film characteristics are exhibited under the following film-forming conditions: a temperature in a range of room temperature to 300° C., a power in a range of 3 to 20 kW for a large-size apparatus, or in a range of 1 to 4 kW for a small-size device, a pressure in a range of 0.3 to 1.2 Pa, and a distance between electrodes in a range of 4 to 10 cm.

With regard to the wiring of Embodiment 5, it is preferable that a film made of a nitride of an Mo—W alloy containing Ar, and a film made of an Mo—W alloy, are stacked one upon another, in order to improve the adhesion with respect to the underlayer (substrate). It has been found that, with regard to a film made of, particularly an Mo—W alloy containing 50 atomic % or less of W, the resistivity is increased by 10 times or more if the film is annealed in the air. This is because the surface of the film is extremely oxidized. It has been also found that the oxidation can be prevented by stacking a film made of a nitride of an Mo—W alloy thereon, and the resistivity is not increased. That is, an Ar-containing Mo—W alloy film is formed by sputtering, and then a nitride of an Mo—W alloy containing 50 atomic % or less of N is formed thereon by sputtering. Further, the film is plasma-processed by a mixture gas of $CF_4$ and $O_2$. Thus, a wiring portion which is not easily oxidized, and having a low resistance, can be formed. In this case, such a film can be formed in the same process as that of the formation of the MoW alloy film. It should be noted that the resistance value is drastically increased when the nitrogen (N) content is 50 atomic % or more, and therefore the N content should be set to 50 atomic % or less.

(Example 9)

In this embodiment, the same members as those of Example 8 will be designated by the same reference numerals, and a detailed description of each of these members will be omitted.

Figure 32:
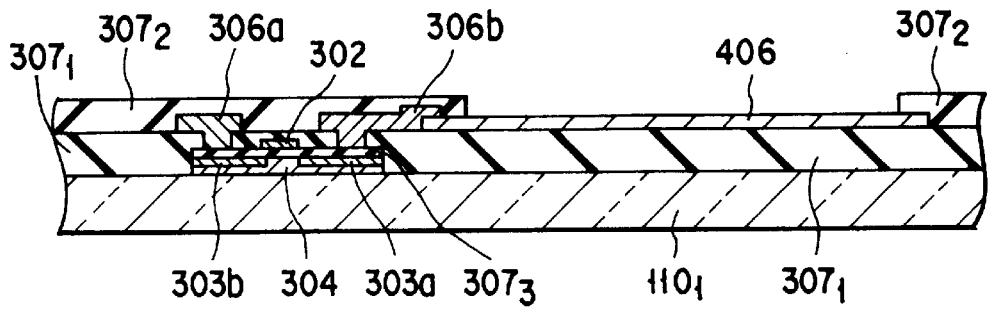
FIGS. 32 and 33 are cross sections showing other examples of the liquid crystal driving circuit board of a liquid crystal display device employing the electrode wiring material of the present invention.

Example 9 is different from Example 8 in terms of liquid crystal driving circuit board and wiring material. FIG. 32 is a cross sectional view showing another example of a liquid crystal driving circuit board of a liquid crystal display device employing the electrode wiring material of the present invention. This liquid crystal driving circuit substrate will now be described mainly in connection with the structures of its TFT and accumulation capacitance portion, and the processing thereof. A polycrystal Si film 304 having a thickness of 100 nm is formed on a glass substrate $110_1$, and a gate oxide film $307_3$ having a thickness of 100 nm is formed thereon. Further, a gate electrode 302 made of an Mo—Ti alloy containing 0.1 atomic % of Ar, is formed thereon. The Mo—Ti alloy contains 10 atomic % of Ti.

The gate electrode 302 is formed in the following manner. First, a glass substrate $110_1$ is placed in a small-size single-sheet load-lock type sputtering apparatus, and the temperature of a substrate before the formation of a film is set to 150° C., the film-forming power is set to 2 kW, and the distance between electrodes is set to 5.5 cm. Then, in an atmosphere of Ar gas of a pressure of 0.6 Pa, sputtering is carried out with use of an MoW alloy target, and MoW containing 10 atomic % of Mo was deposited on the glass substrate $110_1$, thus forming an MoW alloy film having a thickness of 300 nm. The Ar content in the film was 0.1 atomic %, the lattice constant was 3.14 angstrom, which is substantially equal to that of the bulk state. Further, the resistivity of the MoW alloy film could be reduced to a sufficiently low level, that is, 25 $\mu\Omega$·cm.

On the above-structure, source/drain portion $n^+$ polycrystal Si layers 303a and 303b are formed, and an island-like polycrystal Si activation layer 304 is formed. These layers can be formed by implanting phosphorus at a dose amount of $1\times10^{16}$ cm$^{-3}$, using the gate electrode 302 as a mask. Further, an interlayer insulating film $307_1$ having a thickness of 300 nm is formed thereon by thermal CVD.

In a pixel region, a pixel electrode 406 is formed by patterning an ITO film having a thickness of 100 nm formed by sputtering. Further, in an interlayer insulating films (SiOx) $307_1$ of the contact portion and the gate portion, contact holes are formed by etching using diluted HF. Then, a Mo—W alloy containing Ar is deposited thereon by sputtering so as to form a Mo—W alloy film having a thickness of 300 nm, and thus formed film is patterned, forming a signal line, a source electrode (first main electrode) 306a and a drain electrode (second main electrode) 306b. The Mo—W alloy contains 60 atomic % of W.

The signal line and the like are formed in the following manner. First, a glass substrate $110_1$ is placed in a small-size single-sheet load-lock type sputtering apparatus, and the temperature of a substrate before the formation of a film is set to 150° C., the film-forming power is set to 3 kW, and the distance between electrodes is set to 5 cm. Then, in an atmosphere of Ar gas of a pressure of 0.8 Pa, sputtering is carried out with use of an MoW alloy target, and a MoW alloy film containing 60 atomic % of W and having a thickness of 300 nm was formed. The Ar content in the film was 0.2 atomic %, the lattice constant was 3.16 angstrom, which is substantially equal to that of the bulk state. Further, the resistivity of the Mo—W alloy film could be reduced to a sufficiently low level, that is, 14 $\mu\Omega$·cm.

On a TFT region, a passivation SiNx film $307_2$ is provided by forming an SiNx film by plasma CVD, followed by etching the pixel and the peripheral circuit connection portion by RIE. Thus, a liquid crystal drive circuit substrate 310 is constituted.

With use of the liquid crystal drive circuit substrate 310 having the above-described structure, a liquid crystal display device was manufactured in a similar manner to that of Example 8, and was subjected to an evaluation similar to that of Example 8. The results indicated that the liquid crystal display device exhibits effects similar to those achieved by Example 8. In addition, the following effects were obtained. That is, conventionally, Al is used as the metal material for the signal line, and therefore it is required that a barrier metal having a high melting point, such as Mo, should be provided between ITO and $n^+$-type polycrystal Si. In contrast, according to the present invention, the Mo—W alloy which has a low resistance and is a barrier metal is used as the metal material for the signal line, and therefore a barrier metal is no longer necessary, making it possible to reduce the number of steps.

(Example 10)

Figure 33:
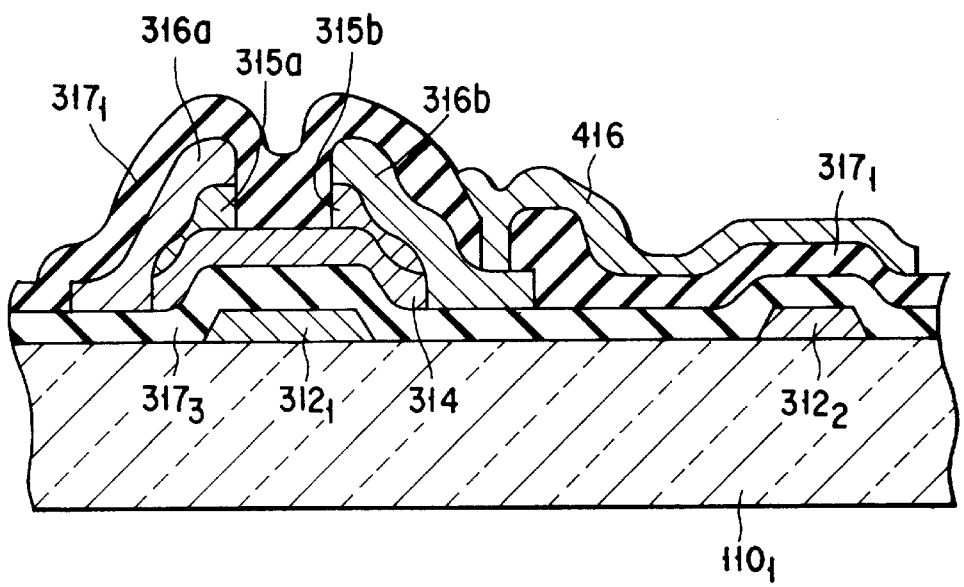

Example 10 is different from Example 8 in terms of liquid crystal driving circuit board and gate electrode. FIG. 33 is a cross sectional view showing another example of a liquid crystal driving circuit board of a liquid crystal display device employing the electrode wiring material of the present invention. This liquid crystal driving circuit board employs a TFT having a structure formed by etching $n^+$-type amorphous silicon on a channel region. Further, the storage capacitance portion is formed of the wiring portion of the same layer as that of the gate electrode and the data wiring portion.

The liquid crystal driving circuit substrate is formed in the following manner. First, with the Mo—W alloy which is used in Example 8 as the wiring metal, a gate electrode $312_1$ and a Cs wiring portion $312_2$ are formed integrally at the same time on a glass substrate $110_1$. The formation of the Mo—W film is carried out as in Example 8. Next, an interlayer insulating film $317_3$, an amorphous Si activation layer 314, and $n^+$-type amorphous Si layers 315a and 315b are formed in this order, and are then patterned. Next, a source electrode 316a and a drain electrode 316b are formed of the above-mentioned wiring metal, at the same time. Next, an oxide film $317_1$ is formed thereon, and a contact hole is made in the drain electrode 316b. Further, a pixel electrode 416 is formed in a pixel region. It should be noted that a storage capacitor is formed between the pixel electrode 416 and the Cs wiring portion $312_2$.

With use of the liquid crystal drive circuit substrate 310 having the above-described structure, a liquid crystal display device was manufactured in a similar manner to that of Example 8, and was subjected to an evaluation similar to that of Example 8. The results indicated that the liquid crystal display device exhibits effects similar to those achieved by Example 8. In addition, the following effects were obtained. That is, since the etching can be carried out by CDE in the manufacture step, and the resistivity of each of the Mo and W oxide films is low, the ITO film can achieve good contact. Therefore, a barrier metal is not required.

In the above-described Examples 8 to 10, the structural elements are not limited to the contents of the respective Examples. For example, as the semiconductor material, not only polycrystal Si or amorphous Si, but fine-crystal Si which belongs between these two phases, may be used.

Further, compound semiconductors such as CdSe and SiGe may be used. As the insulating film formed on the data line, not only an oxide film, but also a nitride film or oxide-nitride film may be used. As the switching element, not only the transistor, but also an MIM or a diode may be used in place of the transistor used in Example 8. The electrode wiring material of the present invention can be applied to the electrode wiring of a simple matrix liquid crystal display device.

Further, the alloys used in these examples may be used in the form of a single layer, a stacked film of two or more layers made of alloys having different compositions from each other, or a stacked film in which an alloy film mainly of Mo and W and containing nitrogen is formed on a film of an Mo—W alloy.

On the surface of any of the above-described Mo—W alloy films described in the above Examples, that is, on the upper layer of the Mo—W alloy film, a metal film of Ta, Ta—N, Ta—Mo, Ta—Nb, Ta—W, Ta—Nb—N, Ta—Mo—N, or Ta—W—N, or an alloy of any of these, may be laminated, so as to improve the anti-acid properties. Further, a film made of Al, Cu, Au or the like may be provided underneath the Mo—W alloy film, so as to further decrease the resistance.

Further, Embodiment 5 is not limited to these Examples, and it can be modified into a variety of versions as long as the essence of the embodiment falls within a range of the invention.

(Example 11)

Figure 34:
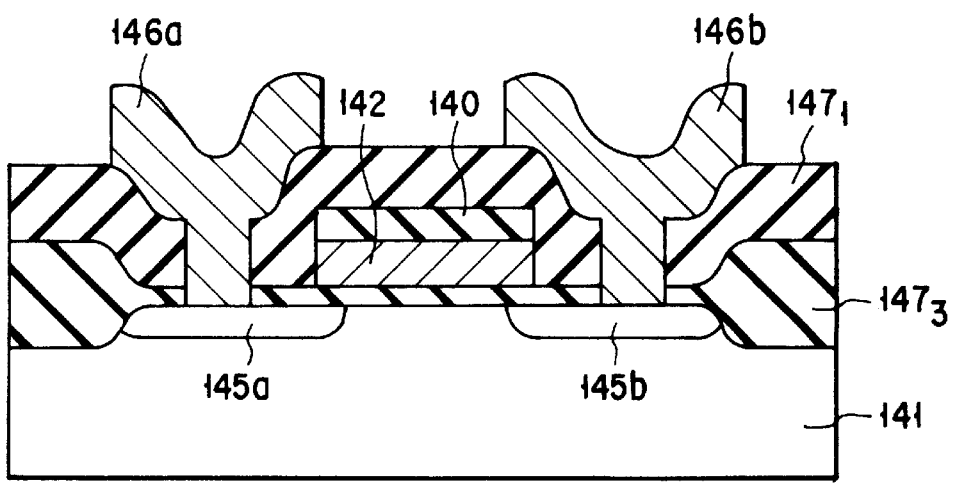
FIG. 34 is a cross sectional view showing the circuit board of a semiconductor device employing the electrode wiring material of the present invention.

FIG. 34 shows the case where an MoW alloy film containing 0.05 atomic % of Ar is applied to a MOS transistor of a DRAM.

The specific structure of the DRAM is as follows. FIG. 34 illustrates a Si monocrystal substrate 141. On the monocrystal substrate 141, n$^+$-type regions 145$a$ and 145$b$, which are impurity diffusion regions, are formed. On the monocrystal substrate 141, a LOCOS oxide silicon film 147$_3$ is formed. On the LOCOS oxide silicon film 147$_3$, a gate electrode 142 made of an MoW alloy can be formed.

The MoW alloy film is formed in the following manner. First, a glass substrate 141 is placed in a small-size single-sheet load-lock type sputtering apparatus, and the temperature of a substrate before the formation of a film is set to 250° C., the film-forming power is set to 2 kW, and the distance between electrodes is set to 5.5 cm. Then, in an atmosphere of Ar gas of a pressure of 0.6 Pa, sputtering is carried out with use of an MoW alloy target, and a MoW alloy film containing 35 atomic % of W and having a thickness of 300 nm was formed. The lattice constant was 3.16 angstrom, which is substantially equal to that of the bulk state. Further, the resistivity of the Mo—W alloy film could be reduced to a sufficiently low level, that is, 12.5 $\mu\Omega$·cm.

On the gate electrode 142, a silicon nitride film 140 is formed, and a field oxide film 147$_1$ is formed thereon. In the field oxide film 147$_1$, contact holes which reach the n$^+$-type regions 145$a$ and 145$b$ are made, and Al source and drain electrodes 146$a$ and 146$b$ are formed in the contact holes.

In the DRAM, the gate electrode 142 is formed of polycrystal Si or silicide of MOSi$_2$; however the sheet resistance is as high as 1 to 5$\Omega$/□. Therefore, if the material is used as the wiring material used for connecting word lines, the problem of the pulse delay arises. In contrast, if the gate electrode and the word lines (not shown) are formed of the same Ar-containing MoW alloy as that used in Example 8, the resistance can be reduced to about less than a tenth of the above value, that is, 0.35$\Omega$/□. Further, the MoW alloy has excellent heat-resistance properties, low resistance properties, and excellent anti-acid properties, and therefore the MoW alloy is suitable as the wiring material for making gate lines and word lines. Consequently, a DRAM having high speed properties can be provided. The alloy can be used, other than wiring, as a pad electrode.

The electrode wiring substrate of Embodiment 5 is not limited to a DRAM, but naturally it can be applied to other LSIs including an ASIC. Further, the wiring substrate can be applied to a SRAM serving as a semiconductor memory device. With regard to the electrodes in particular, the same material as that of the address line of Example 8 can be applied to a gate electrode of power elements such as a GTO (gate turn-off thyristor), an IGBT (insulated gate bipolar transistor) and thyristor, or a lead-out electrode from a semiconductor layer.

As described, the electrode wiring material of Embodiment 5 includes at least one component selected from Mo and W, as a main component, and contains 0.0003 atomic % to 5 atomic % of Ar, and therefore the material exhibits a sufficiently low resistivity and it can be easily handled.

Further, the electrode wiring substrate of Embodiment 5 has a structure in which an electrode wiring portion is formed on a glass substrate, the electrode wiring portion is made of at least one component selected from Mo and W, and the lattice constant of the material of the electrode wiring portion is substantially equal to the lattice constant of the bulk state of the material. With this structure, a high reliability can be achieved.

The above embodiments 1–4 may be combined.

According to the present invention, the address wiring line formed of the Mo—W alloy or Mo—Cr alloy having low resistivity has low resistance, and no delay of gate pulses occurs due to the wiring resistance. Thus, delay-free gate pulses can be applied to predetermined switching elements for driving liquid crystal. In this case, a step coverage of an interlayer insulating film, which is formed on the address wiring line made of a taper-workable Mo—W alloy or Mo—Cr alloy, is improved, and a high insulation breakdown voltage can be obtained between the address wiring line and other wiring line formed on the interlayer insulation film. Thus, even if the display region is enlarged, the liquid crystal display device with high reliability can be obtained. Furthermore, apart from the display with large display area, the decrease in resistivity of the address wiring line makes it possible to reduce the wiring width and increase the opening ratio accordingly.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrode wiring board comprising:
    a glass substrate; and
    an electrode wiring portion formed on said glass substrate;
    wherein said electrode wiring portion is made of at least one metal material selected from Mo and W, and a variation of a lattice constant of said material to a lattice constant of a bulk state of said material of said electrode wiring portion is within ±3%.

2. The wiring board according to claim 1, wherein the variation of the lattice constant of said material to the lattice constant of the bulk state of said material of said electrode wiring portion is within ±1%.

3. The wiring board according to claim 1, wherein said wiring board is used in a semiconductor device or a liquid crystal display device.

4. The material according to claim 1, wherein Ti is added to said main component.

5. The material according to claim 1, wherein a content of said W or Mo is 10 atomic % to 95 atomic %.

6. The material according to claim 1, wherein said electrode wiring portion is formed by a sputtering method.

7. An electrode wiring board comprising:

a glass substrate; and an electrode wiring portion formed on said glass substrate;

wherein said electrode wiring portion is made of W or at least one metal material selected from W, Mo and Cr, and a variation of a lattice constant of said material to a lattice constant of a bulk state of said material of said electrode wiring portion is within ±3%.

8. The wiring board according to claim 7, wherein the variation of the lattice constant of said material to the lattice constant of the bulk state of said material of said electrode wiring portion is within ±1%.

9. The wiring board according to claim 7, wherein said wiring board is used in a semiconductor device or a liquid crystal display device.

10. The material according to claim 7, wherein Ti is added to said main component.

11. The material according to claim 7, wherein a content of said W or Mo is 10 atomic % to 95 atomic %.

12. The material according to claim 11, wherein said electrode wiring portion is formed by a sputtering method.

* * * * *